(12) United States Patent
Dzhigan et al.

(10) Patent No.: US 10,171,041 B2
(45) Date of Patent: Jan. 1, 2019

(54) PREDISTORTION DEVICE

(71) Applicant: Huawei Technologies Co., Ltd., Shenzhen (CN)

(72) Inventors: Victor Ivanovich Dzhigan, Moscow (RU); Dmitry Anatolievich Dolgikh, Moscow (RU); Anton Igorevich Smekalov, Moscow (RU); Huaping Shi, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/975,340

(22) Filed: May 9, 2018

(65) Prior Publication Data

US 2018/0262168 A1 Sep. 13, 2018

Related U.S. Application Data

(63) Continuation of application No. PCT/RU2015/000757, filed on Nov. 10, 2015.

(51) Int. Cl.
*H03F 1/32* (2006.01)
*H04B 1/04* (2006.01)

(52) U.S. Cl.
CPC ......... *H03F 1/3258* (2013.01); *H03F 1/3247* (2013.01); *H03F 1/3252* (2013.01);
(Continued)

(58) Field of Classification Search
None
See application file for complete search history.

(56) References Cited

U.S. PATENT DOCUMENTS 8,842,033 B1 * 9/2014 Abramzon .......... H03M 1/0626
341/144
9,048,796 B2 * 6/2015 Lozhkin ................ H03F 1/3258
455/114.3
(Continued)

FOREIGN PATENT DOCUMENTS

EP 1791310 A1 5/2007
EP 2244380 A1 10/2010

OTHER PUBLICATIONS

Bouchard, M. et al., "Multichannel Recursive-Least-Squares Algorithms and Fast-Transversal-Filter Algorithms for Active Noise Control and Sound Reproduction Systems," IEEE Transactions on Speech and Audio Processing, vol. 8, No. 5, Sep. 2000, pp. 606-618.
(Continued)

*Primary Examiner* — Lana N Le
(74) *Attorney, Agent, or Firm* — Slater Matsil, LLP

(57) ABSTRACT

The disclosure relates to a predistortion device for a non-linear PA device, comprising: an input terminal for receiving an input signal; a predistortion filter, connected between the input terminal and the non-linear PA device; a first delay element, coupled to the input terminal, and configured to delay the input signal by a time delay D to provide a delayed input signal; and an adaptive filter unit, comprising an adaptive filter having adjustable filter weights, and configured to filter the delayed input signal, and an adjusting unit, wherein the adjusting unit is configured to process an adaptive algorithm, based on the delayed input signal, to adjust the filter weights of the adaptive filter, and to provide both the adaptive filter and the predistortion filter with the same adjusted filter weights.

20 Claims, 21 Drawing Sheets

(52) U.S. Cl.
CPC ..... *H04B 1/0475* (2013.01); *H04B 2001/045* (2013.01); *H04B 2001/0416* (2013.01)

(56) References Cited

U.S. PATENT DOCUMENTS

| | | | | |
|---|---|---|---|---|
| 9,172,334 | B2* | 10/2015 | Hammi | H03F 1/0288 455/114.3 |
| 2004/0179629 | A1 | 9/2004 | Song et al. | |
| 2006/0008026 | A1* | 1/2006 | Wood | H03F 1/3241 375/296 |
| 2006/0088090 | A1* | 4/2006 | Azenkot | H04L 25/03057 375/233 |
| 2008/0130789 | A1* | 6/2008 | Copeland | H03F 1/3247 375/297 |
| 2008/0211576 | A1* | 9/2008 | Moffatt | H03F 1/3247 455/114.3 |
| 2008/0260066 | A1* | 10/2008 | Cai | H03F 1/3294 375/297 |
| 2009/0088093 | A1* | 4/2009 | Nentwig | H03F 1/3241 455/114.3 |
| 2013/0034188 | A1 | 2/2013 | Rashev et al. | |
| 2015/0015328 | A1 | 1/2015 | Chang et al. | |
| 2015/0110165 | A1* | 4/2015 | Ramadoss | H04L 25/03885 455/114.3 |
| 2015/0146769 | A1* | 5/2015 | Omer | H04L 25/03159 375/232 |
| 2015/0229498 | A1* | 8/2015 | Sulimarski | H04L 1/0033 375/297 |

OTHER PUBLICATIONS

Ding, Y. et al., "Adaptive Linearization for Power Amplifier in OFDM Systems," SICE-ICASE International Joint Conference 2006, Oct. 18-21, 2006 in Bexco, Busan, Korea, pp. 751-754.

Diniz, P.S.R. "Adaptive Filtering-Algorithms and Practical Implementation," The Springer International Series in Engineering and Computer Science, vol. 399, 1997, XV, 443 p., 1 page.

Eun, C. et al., "A New Volterra Predistorter Based on the Indirect Learning Architecture," IEEE Transactions on Signal Processing, vol. 45, No. 1, Jan. 1997, pp. 223-227.

Haykin, S., "Adaptive Filter Theory," 2nd edition, Prentice Hall, 1991, 1 page.

Kuo, S.M. et al., ":Active Noise Control: A Tutorial Review," Proceedings of the IEEE, vol. 87, No. 6, Jun. 1999, pp. 943-973.

Nezami, M. K., "Fundamentals of Power Amplifier Linearization Using Digital Pre-Distortion," High Frequency Electronics, Sep. 2004, 4 pages.

Poltmann, R.D., "Conversion of the Delayed LMS Algorithm into the LMS Algorithm," IEEE Signal Processing Letters, vol. 2, No. 12, Dec. 1995, p. 223.

Sayed, A.H., "Fundamentals of Adaptive Filtering," Wiley, NY, 2003, 4 pages.

Zhou, D. et al., "Novel Adaptive Nonlinear Predistorters Based on the Direct Learning Algorithm," IEEE Transactions on Signal Processing, vol. 55, No. 1, Jan. 2007, pp. 120-133.

Zhou, D. et al., "Affine Projection Algorithm Based Direct Adaptations for Adaptive Nonlinear Predistorters," 2006 Fortieth Asilomar Conference on Signals, Systems and Computers, Oct. 29-Nov. 1, 2006, pp. 144-147.

* cited by examiner

PREDISTORTION DEVICE

CROSS-REFERENCE TO RELATED APPLICATIONS

This application is a continuation of International Application No. PCT/RU2015/000757, filed on Nov. 10, 2015, the disclosure of which is hereby incorporated by reference in its entirety.

TECHNICAL FIELD

The present disclosure relates to a predistortion device for a non-linear power amplifier (PA) device. The present disclosure further relates to digital predistortion devices of non-linear PAs used in radio transmitters of communication systems.

BACKGROUND

The PA linearization problem arises in equipment of communication systems where a PA of a transmitter operates in the saturation region providing high efficiency, but suffering from the non-linear distortions.

The problem of PA linearization is often solved by applying predistortion to the PA input signal such that the output signal of the cascade of predistorter and PA is distortionless or almost distortionless. As the predistortion is generally carried out in the digital domain, e.g., based on using digital signal processing principles, the technology is called digital predistortion and the predistortion device is called a Digital Predistorter (DPD). A DPD produces a non-linear transfer function, which is inverse to that of the PA. This action linearizes the Amplitude-to-Amplitude Modulation (AM-AM) and Amplitude-to-Phase Modulation (AM-PM) functions of the DPD and PA in cascade. A DPD is a sort of a non-linear adaptive filter, whose weights are calculated, using adaptive signal processing algorithms. Presently there are two main kinds of DPDs: DPDs with indirect learning (e.g., element 400, see FIG. 4) and DPDs with direct learning (e.g., element 500, see FIG. 5).

In FIGS. 4 and 5, x(k) 402 and 502 is the digital transmitted signal, (e.g., the output signal of a digital modem). Even the non-linear PA output signal exists in continuous time t as y(t); for simplification of notation, a discrete-time presentation is used for both continuous-time and discrete-time (e.g., time-sampled by Analog-to-Digital Converter, ADC) signals as y(k) 406 and 512, where k=0, 1, 2 . . . is the signal sample number, see FIGS. 4 and 5. The same discrete-time form is also used for other continuous signals, as described in the document. The discrete-time representation of continuous signals is useful for simplification of notation and for computer simulations of a DPD. In this case, the discrete time samples are defined as $t(k)=kT_S=k/F_S$, where $F_S$ is the sampling frequency and $T_S$ is the sampling frequency period.

In FIG. 4, scaled by the gain of the PA $G_0$ 411, the signal $x'(k)=G_0^{-1}y(k)$ 410 comes to an input of Predistorter 401. The Predistorter 401 is a non-linear filter, whose weights are calculated on-line by means of the Adaptive Algorithm 403. The architecture of the non-linear filter depends on the PA non-linearity approximation by means of polynomials, splines, etc. Any of the non-linearity approximations can be used in the DPDs described hereinafter.

An Adaptive Algorithm 403 during its operation minimizes the Mean Square Error (MSE) cost function, based on the errors α(k) between the Predistorter Copy 407 (that is the same non-linear filter as the Predistorter 401) and the Predistorter output signals y'(k) 404 and ȳ(k) 408.

The indirect learning DPD 400, see FIG. 4, has a few disadvantages. The output signal y(k) 406 of the PA 405 may be noisy. Because the noisy signal $x'(k)=G_0^{-1}y(k)$ 410 is used for the calculating of adaptive filter (Predistorter) weights, the weights are biased, that leads to the DPD performance degradation. The non-linear filters (e.g., the Predistorter Copy 407 and Non-Linear PA 405) are un-permutated in cascade do not guarantee the same performance (e.g., MSE etc.) as that of the Non-Linear PA and Predistorter in cascade.

These disadvantages are absent in the direct learning DPD 500, see FIG. 5, because of the following reasons: there is no measurement noise in the input signal x(k) 502, which is used for the calculation of the adaptive filter (Predistorter 501) weights. So, there the weights do not need to be biased. The minimized MSE cost function is based on the estimation of errors α(k) 510 between the scaled PA output signal $y(k)=G_0^{-1}y''(k)$ 512 and the delayed by D samples x(k) signal, e.g., d(k)=x(k−D) 508, where D is the system delay, caused the Predistorter 501, Non-Linear PA 505 and some implementation issues. In this case, the error α(k) 510 is a parameter, which directly characterizes the DPD performance, e.g., MSE of the signal at the Non-Linear PA output 506.

A simplified system view of FIG. 5 is shown in FIG. 6. Here, the Predistorter 601 output signal y'(k) 604 is delivered to the input of the PA 605 of a transmitter by means of the Digital-to-Analog Converter (DAC) 607 and frequency Up-Converter 609. The feed-back signal y(k) 612 is delivered for base-band calculations by means of the frequency Down-Converter 613 and ADC 611. Thus, the above mentioned implementation issues, which produce system delay D value, depend on the delays of DAC 607, ADC 611, Up- and Down-Converters 609, 613, at least.

The details of the direct learning DPD 700 are shown in FIG. 7. A main signal path of the direct learning DPD 700 includes the DPD 701 and the non-linear PA device (in general case with memory) 717. The non-linear PA device 717 includes a linear filter 703, the non-linear PA 705 and a fourth delay element (Delay 4) 709. A second signal path of the direct learning DPD 700 includes a third delay element (Delay 3) 707. A third signal path of the direct learning DPD 700 includes a first delay element (Delay 1) 711. The input signal 702 having passed the main path of the direct learning DPD 700, e.g., the signal y(k), is subtracted by a subtraction unit 715 from the delayed input signal 702 having passed the second path to provide an error signal 712. An adaptive algorithm 713 adjusts the weights of the DPD 701 based on the input signal 702 having passed the third signal path, e.g., the delayed input signal 714 and the error signal 712.

There are two main problems as indicated below, which restrict the efficiency of the DPD 700, see FIG. 7, called hereinafter Traditional DPD.

First problem: The step-size $\mu_{max}$ in the gradient search based Adaptive Algorithms, used in the direct learning Traditional DPD 700, has to have a smaller value, see equation (3) below, compared with the case, when both, the Adaptive Filter 701 and the Adaptive Algorithm 713 would use the same input signal x(k) 702, see equation (5) below. A smaller value of the step-size increases the duration of the transient response of the gradient search based Adaptive Algorithms, because the response is increased, if the step-size is decreased.

Second problem: The direct learning Traditional DPD 700, see FIG. 7, cannot use the Recursive Least Squares (RLS) Adaptive Algorithms which are more efficient ones compared with the gradient search based Adaptive Algorithms, because the RLS algorithms become instable in this architecture, as the algorithms do not have a parameter (like a step-size) for the stability control.

As the performance of a DPD depends on its architecture and used algorithms, there is a desire to solve the above-defined two problems and hence to improve the efficiency of DPD.

In order to describe the invention in detail, the following terms, abbreviations and notations will be used:
DPD: Digital Predistorter
PA: Power Amplifier
AM-AM: Amplitude-to-Amplitude Modulation
AM-PM: Amplitude-to-Phase Modulation
ANC: Active Noise Control
LMS: Least Mean Square (Algorithm)
RLS: Recursive Least Squares (Algorithm)
NLMS: Normalized LMS (Algorithm)
AP: Affine Projection
FAP: Fast AP
VSS: variable Step-Size
MSE: Mean Square Error
PSD: Power Spectral Density

SUMMARY

It is the object of embodiments of the invention to provide a concept for improving a digital predistortion device for a non-linear PA.

This object is achieved by the features of the independent claims. Further implementation forms are apparent from the dependent claims, the description and the Figures.

Embodiments of the invention solve at least the above mentioned problems by introducing a modification to the direct learning Traditional DPD 700, see FIG. 7. The modification is achieved by the reconstruction of the desired signal of Adaptive Filter 713 from the DPD error signal 712 and by providing the same input signal 714 to both, the Adaptive Filter and the Adaptive Algorithm. The above mentioned input signal 714 is a delayed (by system delay value D) version of the input signal 702 of the DPD 701. The DPD weights are copies of the above-mentioned adaptive filter weights. The modification according to the disclosure allows to accelerate the adaptation e.g., to decrease the transient response of the adaptive filter if to use the gradient search based Adaptive Algorithms or to use the efficient RLS adaptive algorithms, which cannot be used in the unmodified direct learning Traditional DPD 700 due to stability reasons. The modification to the direct learning Traditional DPD 700 as described hereinafter leads to the Modified DPD 100, 200, 300, see FIGS. 1, 2 and 3 as described below. If the system delay D (in sample number) is small compared with the total number of the Modified DPD weights, e.g., $$D << \sum_{m=1}^{M} N_m,$$

then the arithmetic complexity of the DPD, based on the Least Mean Square (LMS) Adaptive Algorithm, can be reduced to about that of the Traditional DPD 700 as shown below with respect to FIGS. 2 and 3. Here $N_m$ is the number of weights in m-th channel of a multichannel filter, which represents a non-linear filter, M is the number of channels in the multichannel filter. FIGS. 2 and 3 describe mathematically equivalent to FIG. 1, the Modified DPDs, which are used with the LMS algorithm case. The NLMS and AP algorithms also can be used in the similar way. The architectures FIGS. 2 and 3 can be used for any D and $$\sum_{m=1}^{M} N_m$$

relationship, but computational efficiency of the LMS algorithms in the architectures FIGS. 2 and 3 is achieved in particular, if $$D << \sum_{m=1}^{M} N_m.$$

The Modified DPD architectures according to the disclosure have the following advantages: Applying the modification according to the disclosure to the direct learning Traditional DPD 700 allows to use the maximal step-size value $\mu_{max}$ (according to equation (5) below) of the gradient search based Adaptive Algorithms in the direct learning Modified DPD 100, 200, 300 architectures according to the disclosure. An increase of the step-size leads to an acceleration of the adaptation. Applying the modification according to the disclosure makes the RLS algorithms stable in the direct learning Modified DPD 100 architecture as described below. Applying the recursive calculation of the difference of two signals allows to reduce the arithmetic complexity of the direct learning Modified DPD 100 architecture as 200, 300, see description below with respect to FIGS. 2 and 3, to about that of the direct learning Traditional DPD 700, if LMS, Normalized LMS (NLMS) or Affine Projection (AP) algorithms are used for the DPD weights calculation. The advantage of the Modified DPD solution according to the disclosure can also be seen from the performance diagrams of FIGS. 15, 17, 19, 21 below for the LMS adaptive filtering algorithm case.

According to a first aspect, embodiments of the invention relate to a predistortion device for a non-linear PA device. The predistortion device comprises an input terminal for receiving an input signal. The predistortion device further comprises a predistortion filter, connected between the input terminal and the non-linear PA device. The predistortion device further comprises a first delay element, coupled to the input terminal, and configured to delay the input signal by a time delay D to provide a delayed input signal. The predistortion device further comprises an adaptive filter unit, comprising an Adaptive Filter having adjustable filter weights, and configured to filter the delayed input signal, and an adjusting unit. The adjusting unit is configured to process an Adaptive Algorithm, based on the delayed input signal, to adjust the filter weights of the adaptive filter, and to provide both the Adaptive Filter and the predistortion filter with the same adjusted filter weights. Both, the Adaptive Filter and the adjusting unit are coupled to the first delay element in order to receive the same delayed input signal.

By applying the same delayed input signal to both, the Adaptive Filter and the adjusting unit and by providing both, the Adaptive Filter and the predistortion filter with the same adjusted filter weights, the two problems described above are solved. E.g., the step-size $\mu_{max}$ in the gradient search based Adaptive Algorithms can operate with a maximum value as defined by equation (5) below. This maximum value of the step-size decreases the duration of the transient response of the gradient search based Adaptive Algorithms. Further, the predistortion device can use the RLS Adaptive Algorithms which are more efficient ones compared with the gradient search based Adaptive Algorithms. The RLS algorithms are stable in this predistortion filter architecture, also referred to as "modified predistortion filter" architecture hereinafter.

In a first possible implementation form of the device according to the first aspect, the adjusting unit is configured to adjust the filter weights of the Adaptive Filter based on the delayed input signal, an output signal of the Adaptive Filter and an output signal of the non-linear PA device.

Adjusting the filter weights based on the delayed input signal provides the advantage that a maximum step-size $\mu_{max}$ as defined by equation (5) below can be used for the Adaptive Algorithms, based on gradient search, resulting in a faster convergence and thus better predistortion quality.

In a second possible implementation form of the device according to the first implementation form of the first aspect, the predistortion device comprises: an output terminal for providing a first error signal; an output processing stage, coupled between the non-linear PA device and the output terminal, and configured to provide the first error signal based on a combination of the delayed input signal and the output signal of the non-linear PA device.

This provides the advantage that the output processing stage processes a first error signal in which the system delay of the non-linear PA output signal is considered.

In a third possible implementation form of the device according to the second implementation form of the first aspect, the adjusting unit is configured to adjust the filter weights of the Adaptive Filter based on a relation between the delayed input signal and a second error signal that is derived from the first error signal.

This provides the advantage that the adjustment of the filter coefficients can apply the maximum step-size according to equation (5) below for the Adaptive Algorithms, based on gradient search.

In a fourth possible implementation form of the device according to the third implementation form of the first aspect, the predistortion device comprises: an error processing stage configured to provide the second error signal based on a combination of the first error signal and an output signal of the Adaptive Filter.

This provides the advantage that the error processing stage uses both, the Adaptive Filter output signal and the non-linear PA output signal for computing the second error signal, thereby a maximum step-size $\mu_{max}$ as defined by equation (5) below can be used for the Adaptive Algorithms, based on gradient search, resulting in a faster convergence and thus better predistortion quality.

In a fifth possible implementation form of the device according to the fourth implementation form of the first aspect, the error processing stage is configured to provide the second error signal based on a combination of the first error signal, the output signal of the Adaptive Filter and an output signal of the predistortion filter delayed by the time delay D.

This provides the advantage that the error processing stage uses all three available signals, e.g., the Adaptive Filter output signal, the non-linear PA output signal and the non-linear predistortion device output signal for computing the second error signal, thereby a maximum step-size $\mu_{max}$ as defined by equation (5) below can be used for the Adaptive Algorithms, based on gradient search, resulting in a faster convergence and thus better predistortion quality.

In a sixth possible implementation form of the device according to the first aspect as such or according to any of the preceding implementation forms of the first aspect, the Adaptive Filter comprises a multi channel Finite Impulse Response (FIR) filter. Note that in all figures DPD, Adaptive Filter and Adaptive Algorithms look like single-channel ones. It is for the simplicity of the Figures. But as described later all scalar signals like x(k) or x(k–D) followed to the devices inputs are converted inside to vector ones like $x_1(k) \ldots x_M(k)$ or $x_1(k-D) \ldots x_M(k-D)$ as it is shown in the left part of FIG. 9 or in a similar way, that depends on the non-linearity model, used in the DPD, as presented in the text.

This provides the advantage that an FIR filter can simulate any sort of non-linearity, presented by a multi-channel linear filter.

In a seventh possible implementation form of the device according to the fifth implementation form of the first aspect, the predistortion device further comprises: a second delay element, coupled to the predistortion filter, and configured to delay the output signal of the predistortion filter by the time delay D This provides the advantage that the output signal of the predistortion filter is in the correct time relation with respect to the output signal of the non-linear PA when computing the second error signal.

In an eighth possible implementation form of the device according to the seventh implementation form of the first aspect, the Adaptive Filter and the second delay element are implemented by a computational unit forming a substitution of the adaptive filter and the second delay element.

In a ninth possible implementation form of the device according to the eighth implementation form of the first aspect, the computational unit comprises a memory configured to store a plurality of delayed by D samples of the delayed input signal. This provides the advantage that the adaptive algorithm, based on gradient search can be implemented in a computationally efficient way for DPDs, where D is less than total number of the weights of the multichannel FIR filter, which is used in DPD filter.

In a tenth possible implementation form of the device according to the ninth implementation form of the first aspect, the computational unit comprises a first multiplier configured to provide a first signal based on a multiplication of the delayed input signal with the delayed samples stored in the memory.

This provides the advantage that the correlation vector of delayed signals vector $r_D(k)$ is available for computation and complexity is reduced as an implementation similar to the delayed LMS algorithm can be applied.

In an eleventh possible implementation form of the device according to the tenth implementation form of the first aspect, the computational unit comprises a second multiplier configured to provide a second signal based on a multiplication of the first signal with a $r_D(k)$ vector.

This provides the advantage that the $r_D(k)$ vector is available for computation and complexity is reduced as the implementation similar to the delayed LMS algorithm can be applied.

In a twelfth possible implementation form of the device according to the first aspect as such or according to any of the preceding implementation forms of the first aspect, the Adaptive Algorithm is a gradient search based adaptive algorithm having a maximum step-size of approximately $$\frac{1}{3\sum_{m=1}^{M} N_m \sigma_{x_m}^2},$$

where $N_m$ is the number of weights in m-th channel of the M channel filter and $\sigma_{x_m}^2$ is a variance of the input signal of m-th channel.

This provides the advantage that a maximum step-size according to equation (5) below can be used which results in a fast filter convergence and thus an improved performance of the predistortion.

In a thirteenth possible implementation form of the device according to the first aspect as such or according to any of the first to the seventh implementation forms of the first aspect, the Adaptive Algorithm is a RLS adaptive filtering algorithm. FIG. 2 and FIG. 3 are used for gradient search based algorithm, in the Application, and example (architecture and formulas are presented). The architectures are not used for RLS.

This provides the advantage that the RLS algorithm has a superior convergence and error performance and provides fast filter adaptation resulting in a highly accurate predistortion device.

According to a second aspect, embodiments of the invention relate to a method for pre-distorting a non-linear PA device. The method comprises filtering an input signal with a predistortion filter to provide a pre-distorted input signal to the non-linear PA. The method comprises delaying the input signal by a first time delay before D to provide a delayed input signal. The method comprises filtering the delayed input signal with an adaptive filter. The method comprises adjusting filter weights of the adaptive filter based on the delayed input signal. The method comprises providing both, the adaptive filter and the predistortion filter with the same adjusted filter weights.

Such a method solves the two problems identified above by applying the same delayed input signal to both, the filtering and the adjusting and by providing both, the Adaptive Filter and the predistortion filter with the same adjusted filter weights. E.g., the step-size $\mu_{max}$ in the gradient search based adaptive algorithms can operate with the maximum value as defined by equation (5) below. Further, the method can apply the RLS adaptive algorithms which are more efficient ones compared with the gradient search based adaptive algorithms.

According to a third aspect, embodiments of the invention relate to a direct learning Modified DPD, see FIG. 1, where the DPD operates with any gradient search based adaptive algorithms, in particular LMS, NLMS, AP, Fast AP (FAP), with a higher value of a step-size, see equation (5), compared to that, see equation (3), of unmodified Traditional DPD, see FIG. 7.

This provides the advantage of a faster convergence and a stable operation.

In a first possible implementation form of the direct learning Modified DPD according to the third aspect as such, the gradient search based algorithms in the direct learning Modified DPD are used with any sort of Variable Step-Size (VSS).

This provides the advantage of a faster convergence and a stable operation.

In a second possible implementation form of the direct learning Modified DPD according to the third aspect as such or according to the first implementation form of the third aspect, the direct learning Modified DPD uses the RLS adaptive algorithms.

This provides the advantage of fast convergence at a stable operation.

In a third possible implementation form of the direct learning Modified DPD according to the third aspect as such or according to any of the preceding implementation forms of the third aspect, the direct learning Modified DPD is used with any non-linearity model, in particular polynomial, spline etc., which at each sample of Adaptive Filter iteration is viewed as a multichannel linear filter with equal or unequal number of weights in the channels.

This provides the advantage of a high flexibility for providing the non-linearity model.

In a fourth possible implementation form of the direct learning Modified DPD according to the third aspect as such or according to any of the preceding implementation forms of the third aspect, if the system delay D (in sample number) in the direct learning Modified DPD, see FIG. 1, is small compared with a total number of weights N of the DPD, then a further modification is applied to the DPD according to FIG. 3.

This further modification provides the advantage of decreasing the total number of computations per algorithm iteration.

BRIEF DESCRIPTION OF THE DRAWINGS

Further embodiments of the invention will be described with respect to the following figures, in which.

DETAILED DESCRIPTION OF ILLUSTRATIVE EMBODIMENTS

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described method may also hold true for a corresponding device or system configured to perform the method and vice versa. For example, if a specific method block is described, a corresponding device may include a unit to perform the described method block, even if such unit is not explicitly described or illustrated in the figures. Further, it is understood that the features of the various exemplary aspects described herein may be combined with each other, unless specifically noted otherwise.

The devices, methods and systems according to the disclosure are based on one or more of the following techniques that are described in the following: feed-forward ANC, non-linear adaptive filtering, multi-channel adaptive filtering, delayed adaptive filtering, adaptive filtering with delayed convolution compensation and direct learning DPD, in particular direct learning Modified Digital DPD according to the disclosure.

Figure 8:
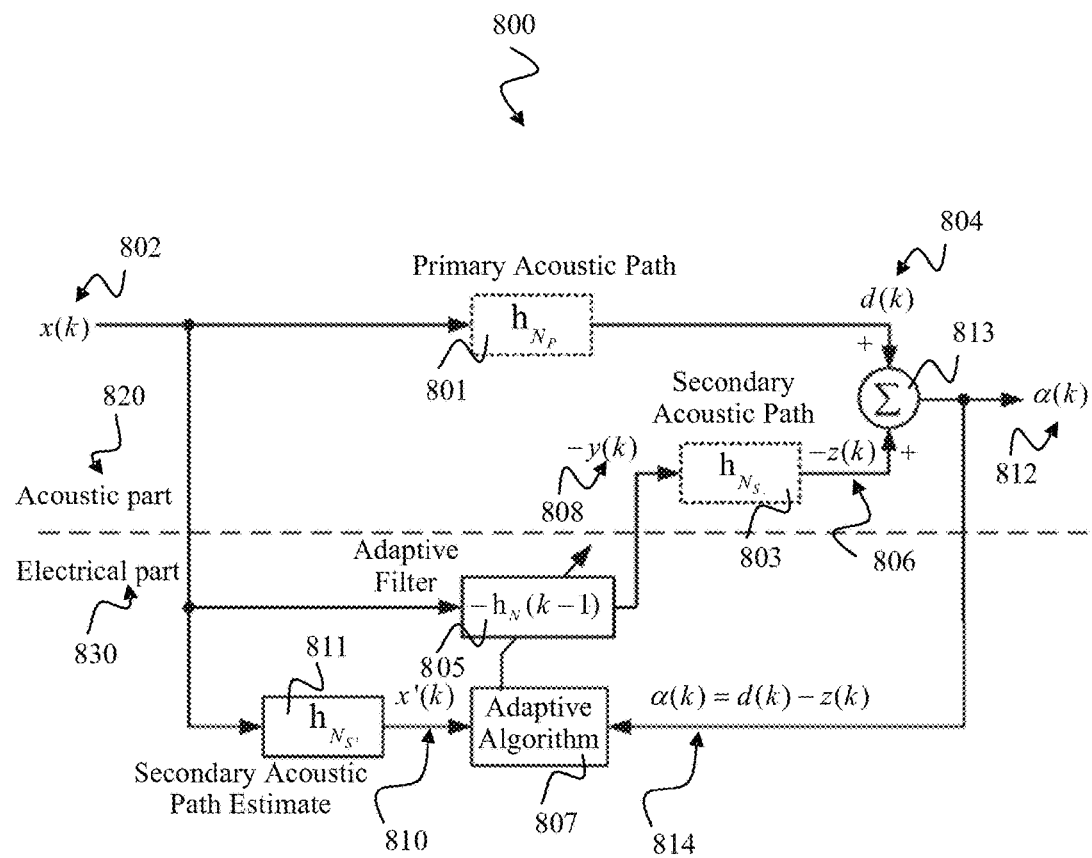
FIG. 8 shows a block diagram illustrating a feed-forward Active Noise Control (ANC) 800.

FIG. 8 shows a block diagram illustrating a feed-forward ANC 800.

Figure 7:
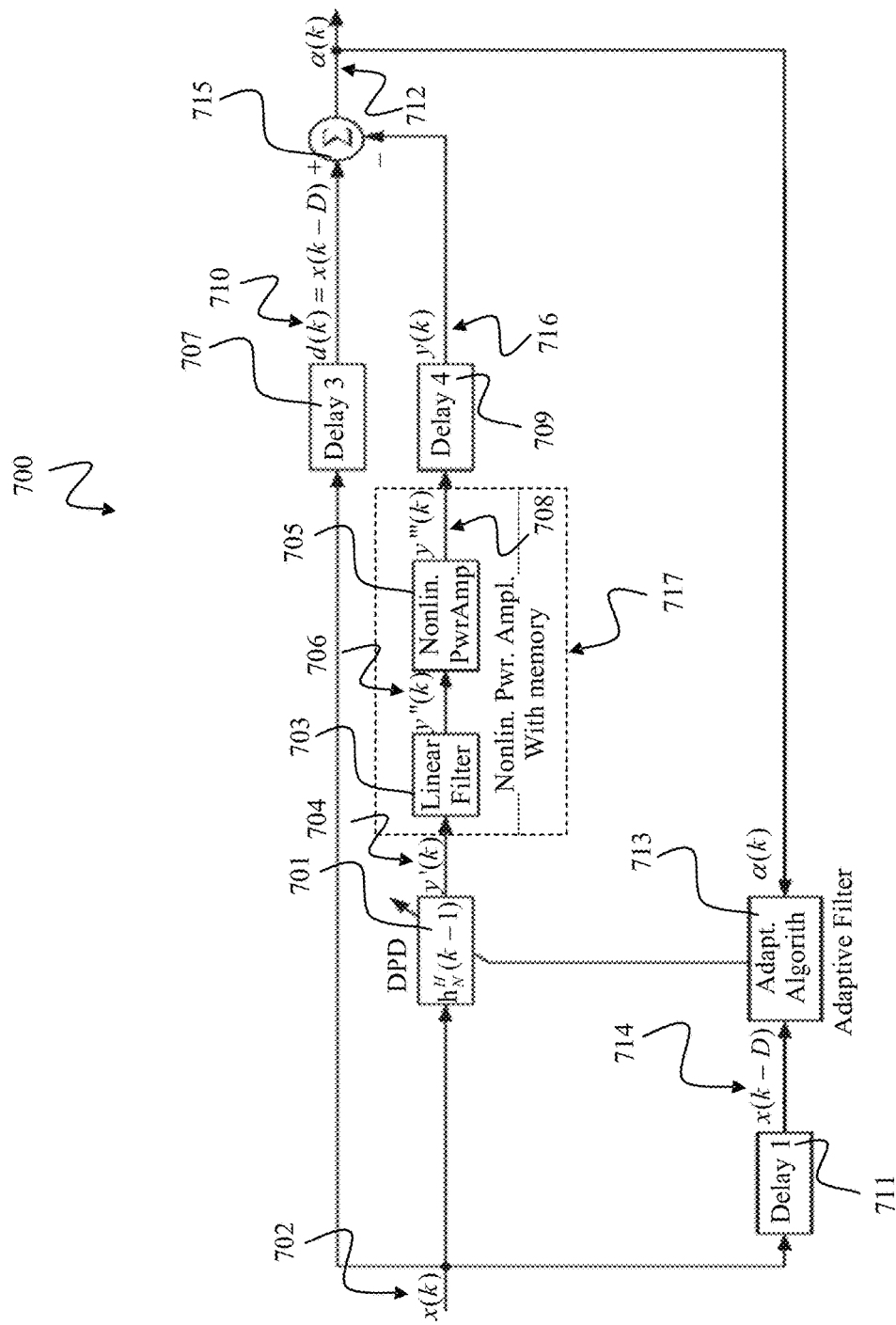
FIG. 7 shows a block diagram illustrating a direct learning Traditional digital predistorter 700.

An examination of the Traditional DPD architecture 700 depicted in FIG. 7 conclude, that the DPD can be viewed as a simplification of the feed-forward ANC system 800 as depicted in FIG. 8.

Both, the direct learning Traditional DPD 700 and the ANC system 800 belong to the family of the feed-forward adaptive filters. Used in the ANC 800, see FIG. 8, the Primary 801 and Secondary 803 Acoustic Paths, e.g., the acoustic filters, and Secondary Acoustic Path Estimate 811, e.g., an electrical (digital) filter, are substituted by the Delay 3, 707; Delay 4, 709 and Delay 1, 711 in the DPD 700, see FIG. 7.

Figure 6:
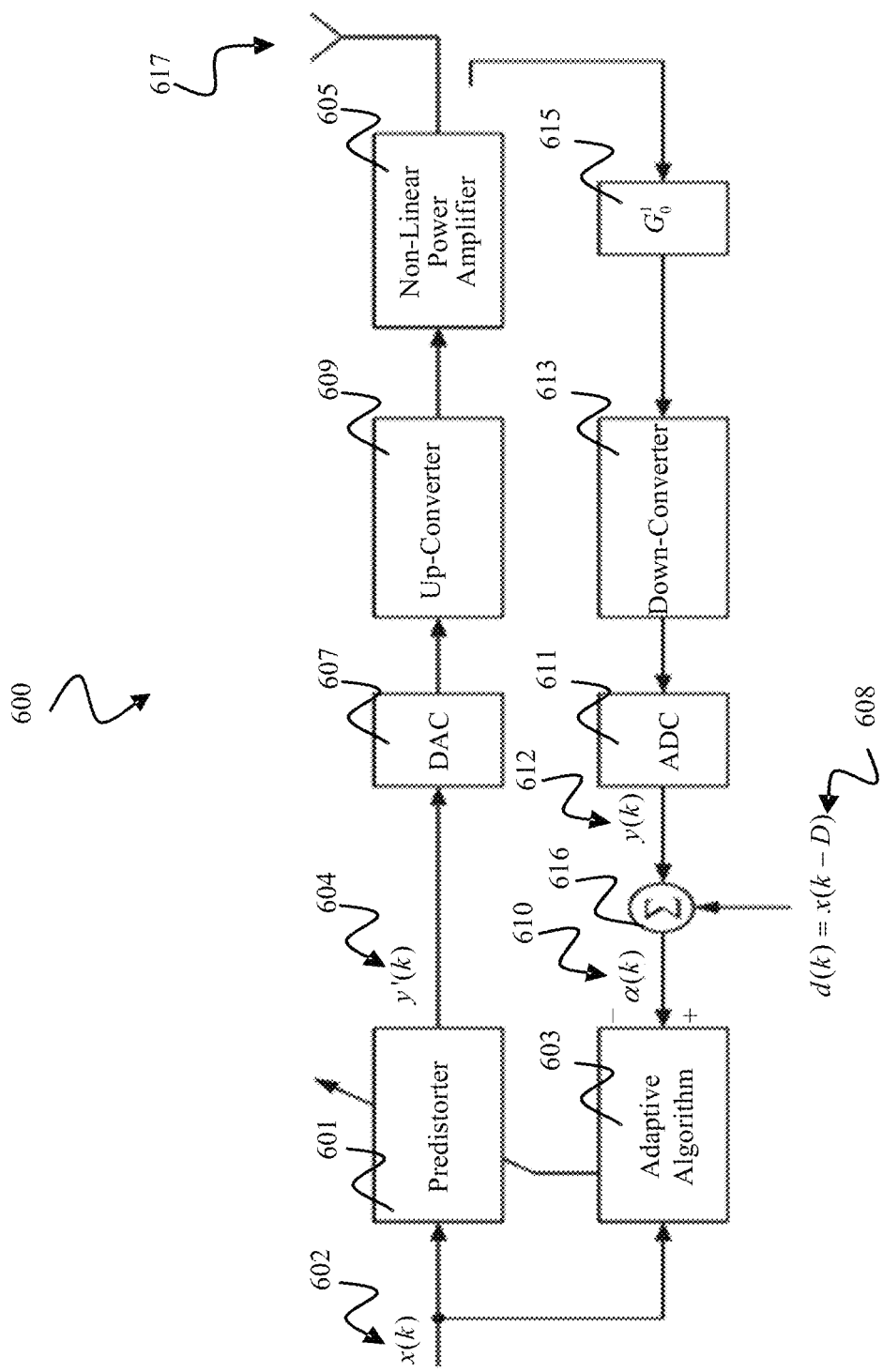
FIG. 6 shows a block diagram illustrating a simplified system view of a direct learning digital predistorter 600.

The delay of Traditional DPD, see FIG. 6, caused by the DAC 607 and ADC 611 (not shown in FIG. 7), Up- and Down-Converters 609, 613 and some other implementation issues, produces the delay of the PA output signal y"(k) 708. The delay is marked as the Delay 4, 709 in FIG. 7. The delay together with the DPD (Predistorter 701) and Non-linear PA 705 (which can have memory in a general case) delays is estimated as D and marked in FIG. 7 as Delay 3, 707. As the signal y(k), 716 appears with delay D relatively to the transmitting signal x(k), 702, the desired signal d(k), 710 of adaptive filter is the D samples delayed signal x(k) in the DPD task, e.g., d(k)=x(k−D). This is because the Predistorter 700 operates in a such a way that y(k)→x(k−D). This is achieved, when $$|\alpha(k)|=|d(k)-y(k)|=|x(k-D)-y(k)|\to\min. \quad (1)$$

As the Adaptive Algorithm 713 operates on the base of the error signal α(k), 712, obtained using delayed signals, the signal x(k), 702, which is also used in the Adaptive Algorithm 713 for the Predistorter 701 weights calculation, has to be also delayed by the same D samples. This delay is marked in FIG. 7 as Delay 1, 711.

In FIG. 8 the signal x(k), 802 comes to the Adaptive Algorithm 807 through the Secondary Acoustic Path Estimate 811, e.g., it is filtered. Due to this reason Adaptive Algorithms 807 used in this architecture 800 are called Filtered-X.

In FIG. 7, the input signal 714 of the Adaptive Algorithm 713 is just a delayed version of the signal x(k) 702.

Figure 9:
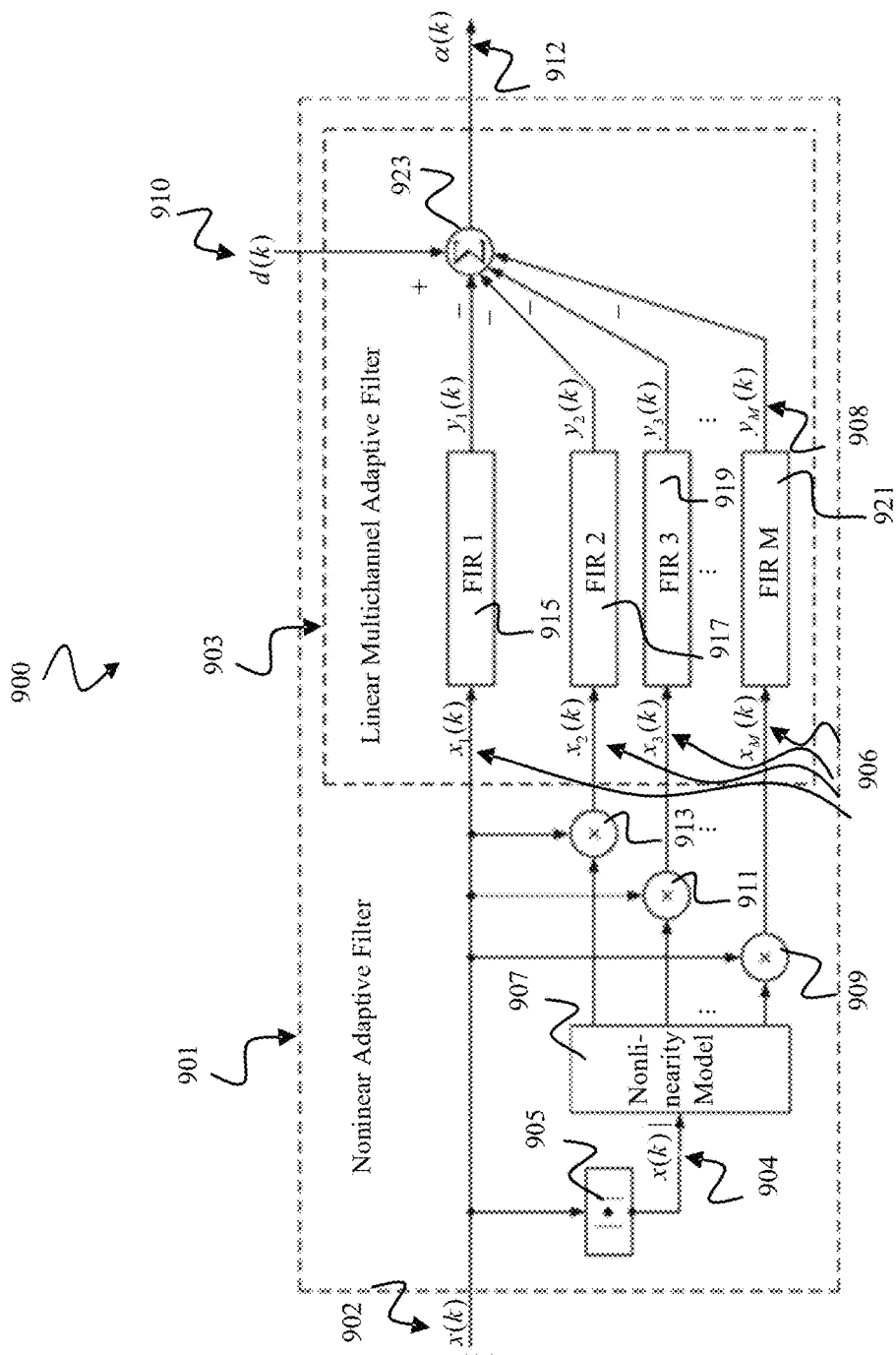
FIG. 9 shows a block diagram illustrating an exemplary non-linearity model 900.

FIG. 9 shows a block diagram illustrating an exemplary non-linearity model 900. The ANC system 800, see FIG. 8, usually uses linear adaptive filters. The Traditional DPD 700, see FIG. 7, uses non-linear adaptive filters. Non-linear adaptive filters can be modeled my means of multichannel linear filters, independently of the used non-linearity model, see an example in FIG. 9.

Generally, one of the filter channels is used to model the linear part of the inverse model of a PA and the other ones are used to model the non-linear part of the inverse model of the PA. In FIG. 9, the linear part is presented by a channel, marked as FIR1 (Finite Impulse Response) 915. The number of weights in the channels can be the same or different, as it is conditionally shown in FIG. 10 by the bars of different length.

Figure 10:
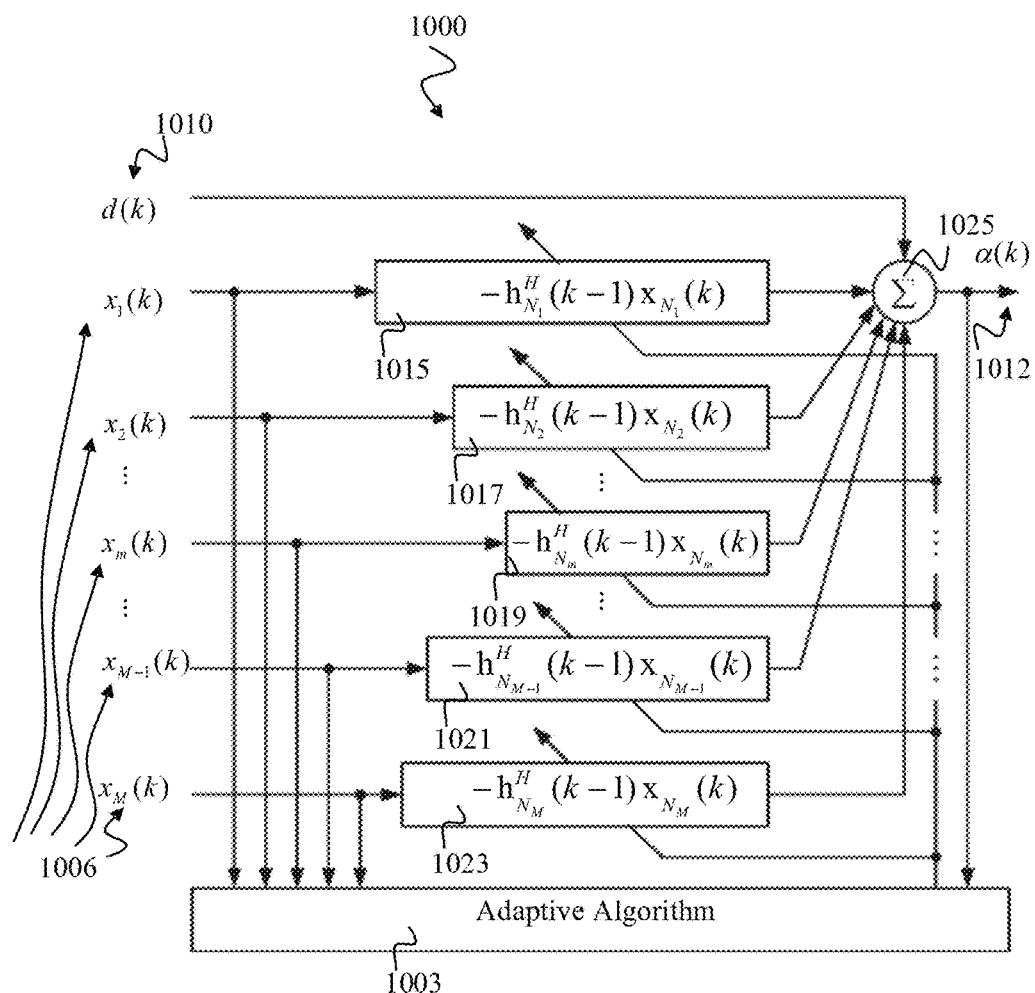
FIG. 10 shows a block diagram illustrating a multichannel adaptive filter 1000.

FIG. 10 shows a block diagram illustrating a multichannel adaptive filter 1000. The filters 1015, 1017, 1019, 1021, 1023 may have different length.

For the Adaptive Filter weights calculation the architectures 700, 800 depicted in FIG. 7 and FIG. 8 can use any of the Adaptive Algorithms based on gradient search, for example: LMS, NLMS, AP and FAP.

Due to the using of the Delay 1, 711 of D samples, see FIG. 7, or the filter $h_{N_{S'}}$ 811 of $N_{S'}$ weights, see FIG. 8, the maximal step-size of gradient search based algorithms $\mu_{max}$ is restricted to the value:

$$\mu_{max} = \frac{1}{3(N+N_{S'})\sigma_x^2} \quad (2)$$

for the ANC system 800, see FIG. 8, and to the value:

$$\mu_{max} = < \frac{1}{3\sum_{m=1}^{M}(N_m+D)\sigma_{x_m}^2} \quad (3)$$

for the DPD 700, see FIG. 7. Here, $\sigma_x^2$ is a variance of the signal x(k), 702 and $\sigma_{x_m}^2$ is a variance of the multichannel adaptive filter input signals $x_m(k)$, 906, 1006, see FIG. 9 and FIG. 10.

The values of equations (2) and (3) are smaller than the following values:

$$\mu_{max} = \frac{1}{3N\sigma_x^2}, \quad (4)$$

$$\mu_{max} = \frac{1}{3\sum_{m=1}^{M} N_m \sigma_{x_m}^2}, \quad (5)$$

e.g., the step-size values of the gradient search based Adaptive Algorithms with no filtered or delayed input signal x(k).

That means, that the transient response of the adaptive filters, used in the architectures 700, 800 of FIG. 7 and FIG. 8, will be longer compared with the cases, when the step-sizes, as defined in equations (4) and (5), are used. Unfortunately, the steep-sizes of equations (5) and (4) cannot be used in the architectures 700, 800 of FIG. 7 and FIG. 8, because the Adaptive Filters become unstable with these step-size values.

The effect of the step-size value in the gradient search based adaptive filtering algorithms is the following: As the step-size value is increased (while the algorithm is stable), the transient response is decreased, that means a speed-up of the adaptation is achieved.

Besides, in the architectures 700, 800 of FIG. 7 and FIG. 8 the more efficient RLS adaptive filtering algorithms also cannot be used, because they do not have a parameter like the step-size, which allows to slow-down the adaptation, making the algorithms stable.

It is known, that the feed-forward ANC system 800, see FIG. 8, can be modified to provide the Adaptive Filter and the Adaptive Algorithm with the same Filtered-X signal, that is $$x_1'(k) = h_{N_S}^T(k-1)x_{N_S}(k), \quad (6)$$

where $$x_{N_S}(k) = [x_1(k), x_1(k-1), \ldots, x_1(k-N_S+1)]^T. \quad (7)$$

Figure 11:
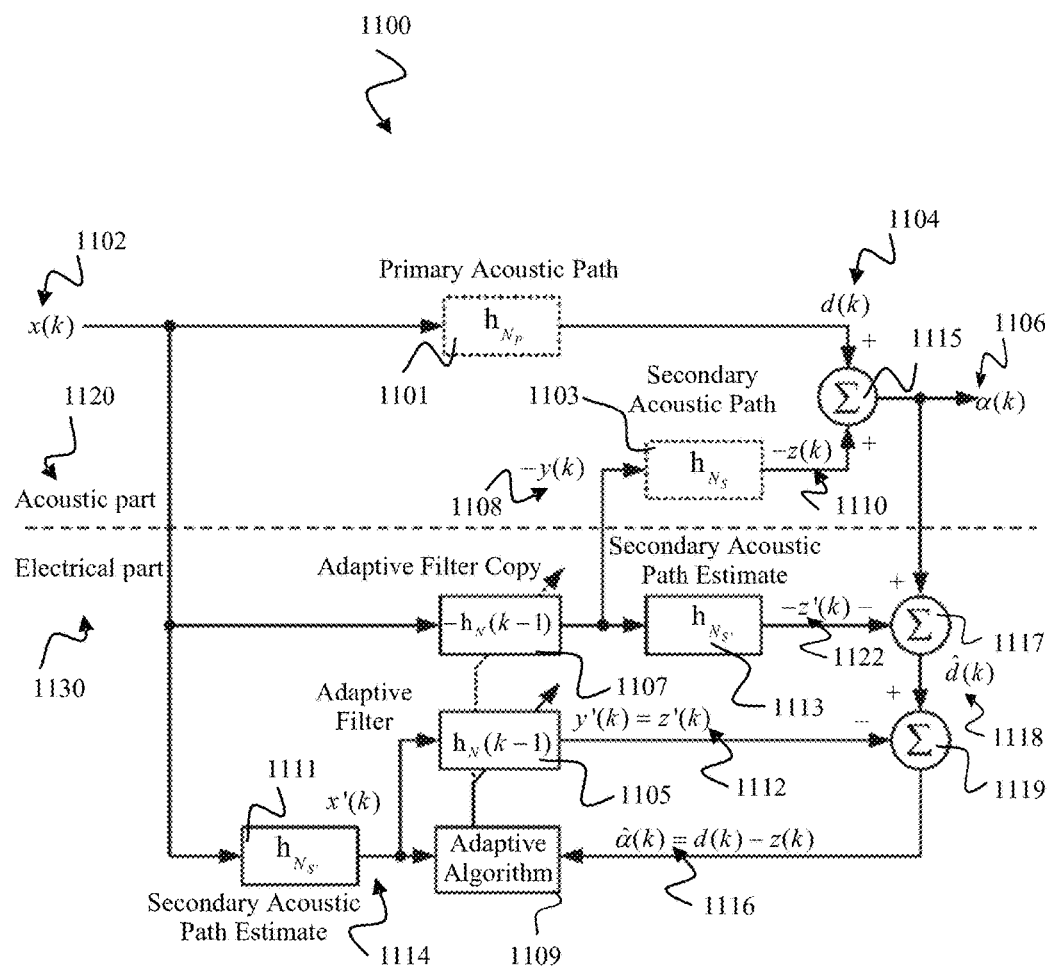
FIG. 11 shows a block diagram illustrating a modified feed-forward ANC 1100.

In this case, the ANC system can use the step-size value, defined as (4). FIG. 11 shows a block diagram illustrating a modified feed-forward ANC system 1100.

Opposite to the feed-forward ANC system 800 of FIG. 8, where the Adaptive Algorithm 807 uses α(k) as the error signal 812, produced acoustically, in the Modified feed-forward ANC system 1100 of FIG. 11, the error signal for the Adaptive Algorithm 1109 is produced electrically. It is done in two steps.

Step 1: In steady-state, the noise signal d(k), 1104 in the plane of the error microphone is estimated from the error signal α(k), 1106 as $$\hat{d}(k) = d(k) - z(k) - [-z'(k)] = d(k) - z(k) + z'(k) \approx d(k). \quad (8)$$

For that, the signal −y(k), 1108, produced by the Adaptive Filter Copy 1107 in the same way as in the feed-forward ANC system 800 of FIG. 8, is filtered as $$-z'(k) = h_{N_S}^T[-y_{N_S}(k)] = -h_{N_S}^T y_{N_S}(k), \quad (9)$$

where $$y_{N_S}(k) = [y_2(k), y_2(k-1), \ldots, y_2(k-N_S+1)]^T. \quad (10)$$

Step 2: The error signal, 1116 for the Adaptive Algorithm 1109 is defined as $$\hat{\alpha}(k) = \hat{d}(k) - y'(k) = d(k) - z(k) + z'(k) - y'(k) = d(k) - z(k) + z'(k) - z'(k) = d(k) - z(k) = \alpha(k), \quad (11)$$

e.g., the error signal 1116 in the Modified feed-forward ANC system 1100 of FIG. 11 is about the same as the error signal 814 in the feed-forward ANC system 800 of FIG. 8. This is because in the steady-state: y'(k)≈z'(k).

So, the acoustic noise compensation path in FIG. 11, e.g., cascade of Adaptive Filter Copy $-h_{N_S}(k-1)$ 1107 and the secondary path $h_{N_S}^T$, 1113 is the same as that in FIG. 8; error signal $\hat{\alpha}(k) = \alpha(k)$, 1116 used by the Adaptive Algorithms 1109, 807, is also about the same in both cases. Besides, in case of the Modified feed-forward ANC system 1100 of FIG. 11, both, the Adaptive Algorithm 1109 and the Adaptive Filter 1105 use the same input signal $x_1'(k)$ according to equation (6). In this case, the step-size $\mu_{max}$ of the Adaptive Filter 1105 can be estimated according to equation (4), because the Adaptive Filter 1105 operates independently of the rest of the Modified feed-forward ANC system 1100 parts, as the Adaptive Filter 1105 and the Adaptive Algorithm 1109 process the input signal $x_1'(k)$ according to equation (6) and the desired signal $\hat{d}(k)$ according to equation (8).

This solution allows to estimate the maximal step-size value $\mu_{max}$ according to equation (4) for the gradient search based Adaptive Algorithms, used in the Modified ANC system 1100 of FIG. 11, as well as to use the efficient RLS Adaptive Algorithms.

Figure 12:
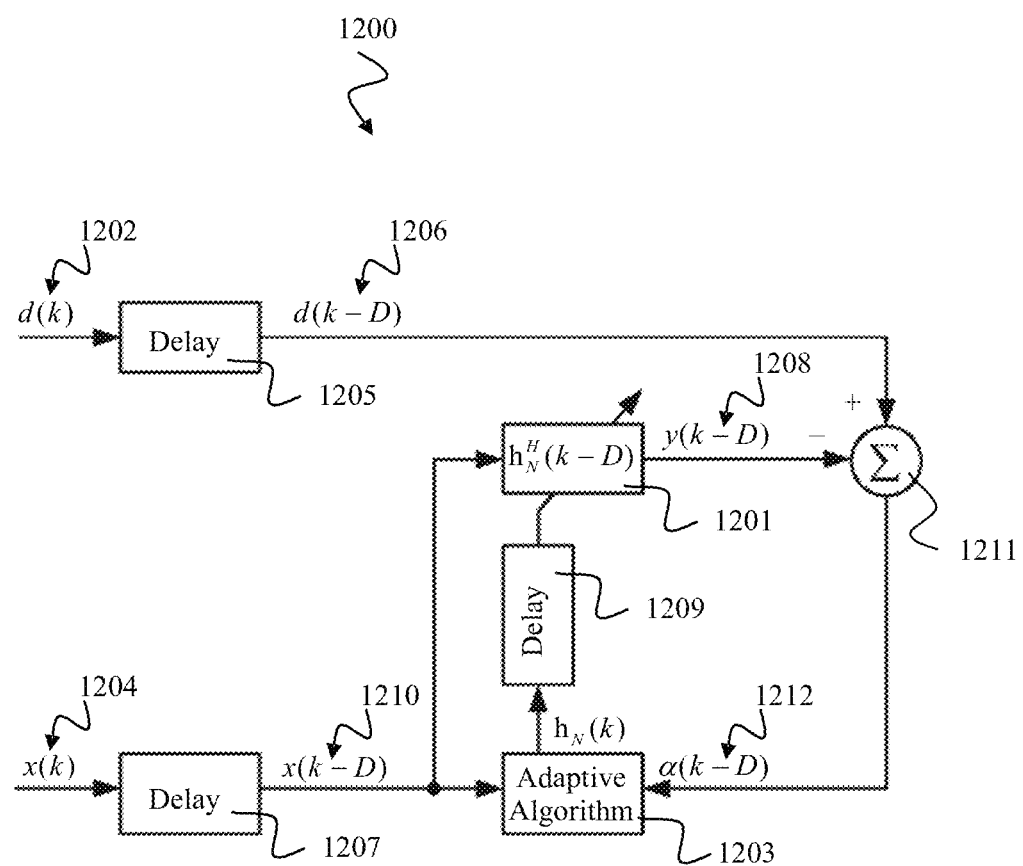
FIG. 12 shows a block diagram illustrating a delayed adaptive filter 1200.

FIG. 12 shows a block diagram illustrating a delayed adaptive filter 1200. The delayed adaptive filter with the LMS algorithm can be described as $$\alpha(k-D) = d(k-D) - h_N^H(k-D-1)x_N(k-D), \quad (12)$$

$$h_N(k) = h_N(k-1) + \mu x_N(k-D)\alpha^*(k-D), \quad (13)$$

where D is a delay value (in samples), see FIG. 12.

The equations (12) and (13) mean that the delayed vector of input signals $x_N(k-D)$, 1210 is used for the adaptive filter output error 1212 and weights update computations. But what is more important, for adaptive filter output, the delayed weights are used as well.

Due to the using of the delayed weighs, to ensure the adaptive filter stability, the maximal step-size value of the adaptive algorithm has to be decreased compared with that of the delayless LMS algorithm. The price of the stability is a slow convergence, caused by a small value of the step-size μ, similarly to the considered direct learning Traditional DPD 700 of FIG. 7 and the Traditional ANC 800 of FIG. 8.

Figure 13:
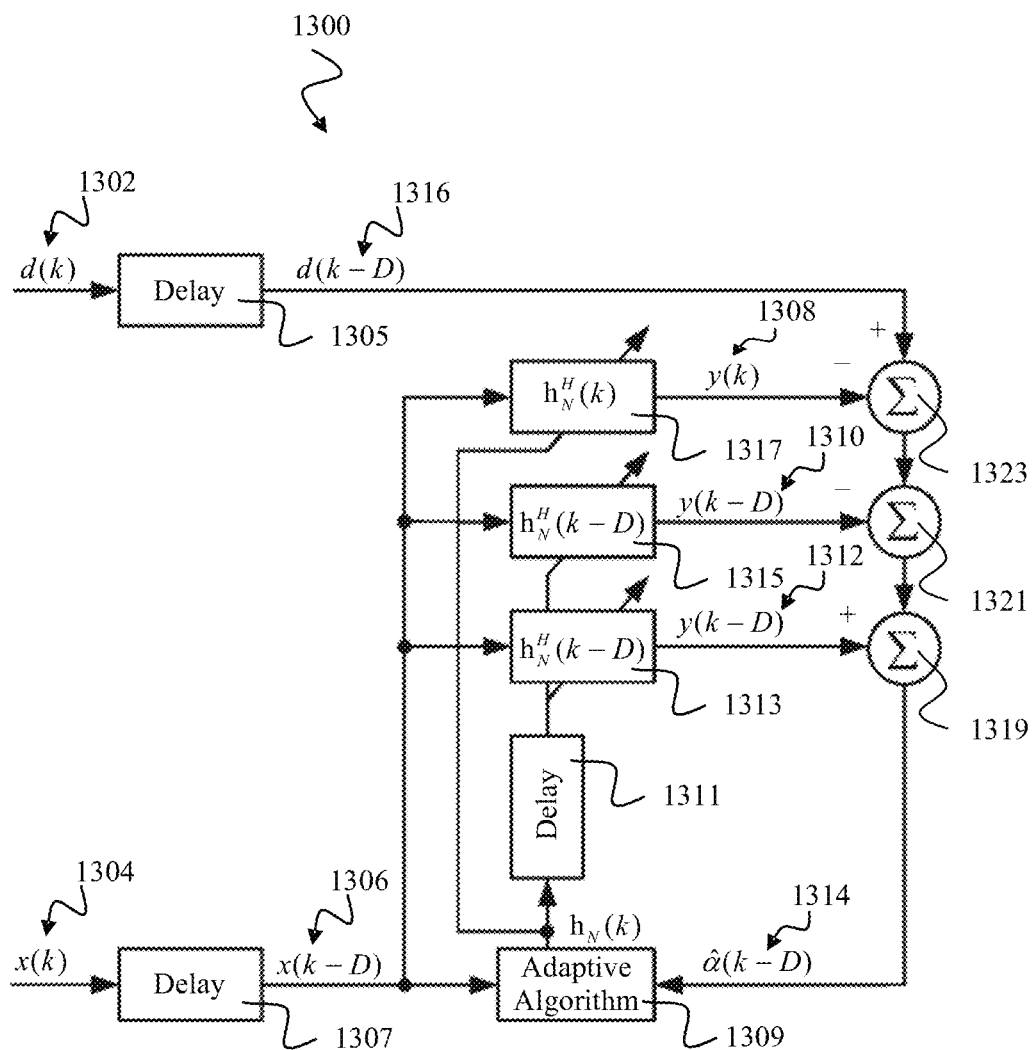
FIG. 13 shows a block diagram illustrating an adaptive filter with delayed convolution compensation 1300.

A modification of the architecture 1200 is shown in FIG. 13. FIG. 13 shows a block diagram illustrating an adaptive filter with delayed convolution compensation 1300.

The modification target is to increase the delayed adaptive filter convergence by means of the step-size increasing in LMS adaptive filtering algorithm. The target is formally achieved by means of the rejection of delayed convolution (delayed signal filtering with delayed weights). In this case instead of equations (12), (13), the delayed LMS algorithm may be computed as:

$$\hat{\alpha}(k-D) = d(k-D) - h_N^H(k-D-1)x_N(k-D), \quad (14)$$

$$h_N(k) = h_N(k-1) + \mu x_N(k-D)\hat{\alpha}^*(k-D). \quad (15)$$

This modification allows to increase the maximum available step value to that of the delayless LMS algorithm. This is achieved by adding two adaptive filters 1317, 1313 to the architecture 1300 of FIG. 13. This addition allows to do some math transformation of equation (14) as shown in the following.

In the result, the error signal $\hat{\alpha}(k-D)$, 1314 is calculated as:

$$\hat{\alpha}(k-D) = d(k-D) - h_N^H(k-1)x_N(k-D) = \alpha(k-D) - \lambda_D^H(k) r_D(k), \quad (16)$$

where $\lambda_D(k)$ and $r_D(k)$ are the vectors, containing D elements each, e.g., $$\lambda_D(k) = [\mu(k-1)\,\hat{\alpha}^*(k-D-1), \quad (17)$$
$$\mu(k-2)\,\hat{\alpha}^*(k-D-2), \ldots, \mu(k-D)\,\hat{\alpha}^*(k-D-D)]^T,$$

$$r_D(k) = \begin{bmatrix} r_1(k-D-1) \\ r_2(k-D-2) \\ \vdots \\ r_D(k-D-D) \end{bmatrix} = \begin{bmatrix} x_N^H(k-D-1) \\ x_N^H(k-D-2) \\ \vdots \\ x_N^H(k-D-D) \end{bmatrix} x_N(k-D). \quad (18)$$

As equation (15) in a general case may use a VSS $\mu(k)$, equation (17) is shown for the general VSS case.

Taking into consideration the shift invariant property of channel signal vectors, which are used to compose the vectors $x_N(k)$, 1006 (see FIG. 10) if the architecture 1000 of FIG. 10 is used, the complexity of the equation (18) can be decreased up to 2DM multiplications and 2DM complex additions as:

$$r_D(k) = \begin{bmatrix} r_1(k-D-1) \\ r_2(k-D-2) \\ \vdots \\ r_D(k-D-D) \end{bmatrix} = \begin{bmatrix} r_1(k-D-2) \\ r_2(k-D-3) \\ \vdots \\ r_D(k-D-D-1) \end{bmatrix} + \quad (19)$$

$$\begin{bmatrix} \sum_{m=1}^{M} [x_m^*(k-D-1)x_m(k-D) - x_m^*(k-D-1-N_m)x_m(k-D-N_m)] \\ \sum_{m=1}^{M} [x_m^*(k-D-2)x_m(k-D) - x_m^*(k-D-2-N_m)x_m(k-D-N_m)] \\ \vdots \\ \sum_{m=1}^{M} [x_m^*(k-D-D)x_m(k-D) - x_m^*(k-D-D-N_m)x_m(k-D-N_m)] \end{bmatrix}.$$

So, the computation of equation (19) is reasonable in the calculation of equation (16) instead of equation (14), if N>>D, or in the multichannel case, if N>>DM.

The calculations can also be applied to the direct learning Modified DPD 100 as described below with respect to FIG. 1.

Figure 1:
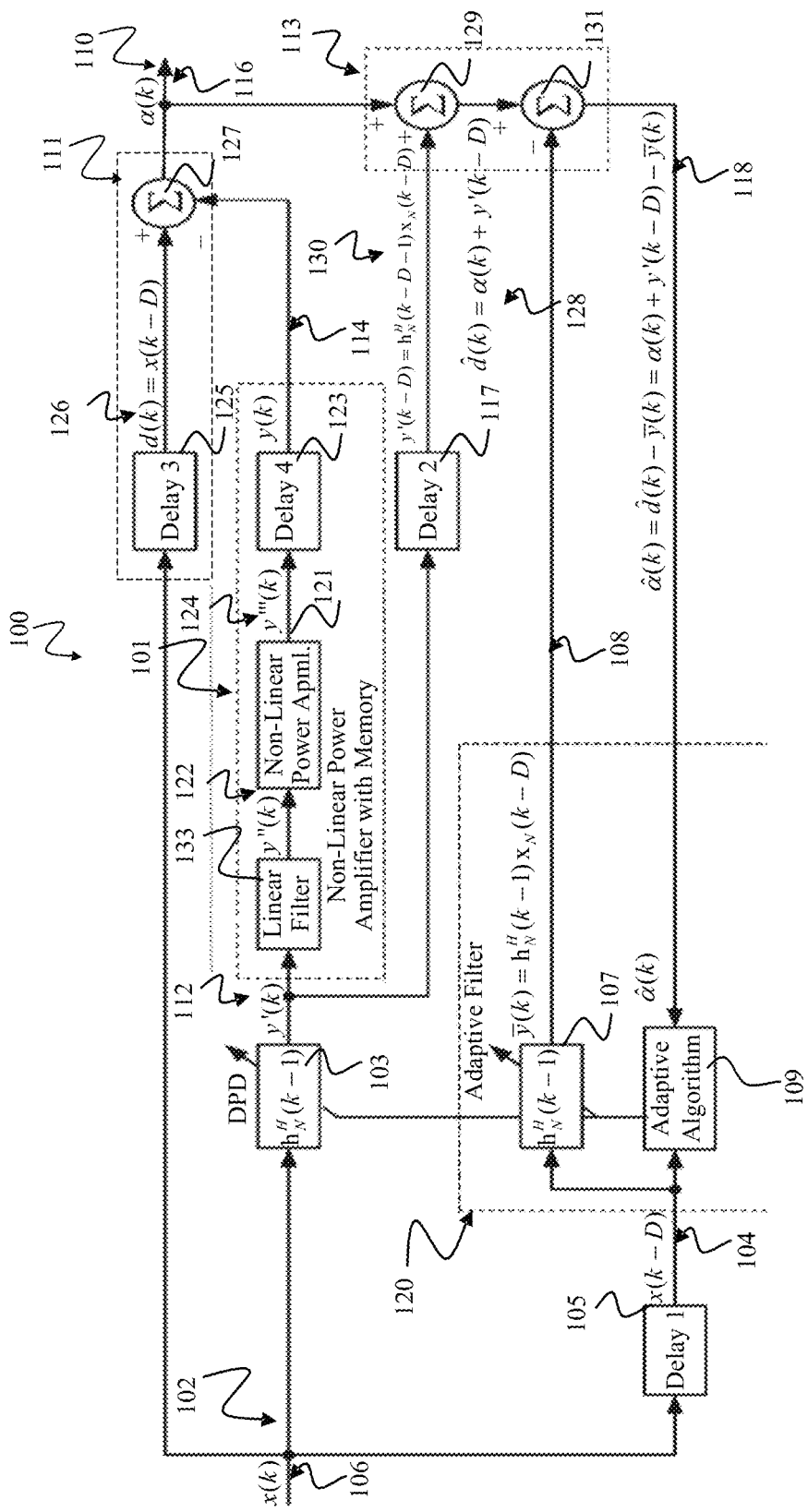
FIG. 1 shows a block diagram illustrating a predistortion device 100 including a modification according to an implementation form of a first architecture.
Figure 3:
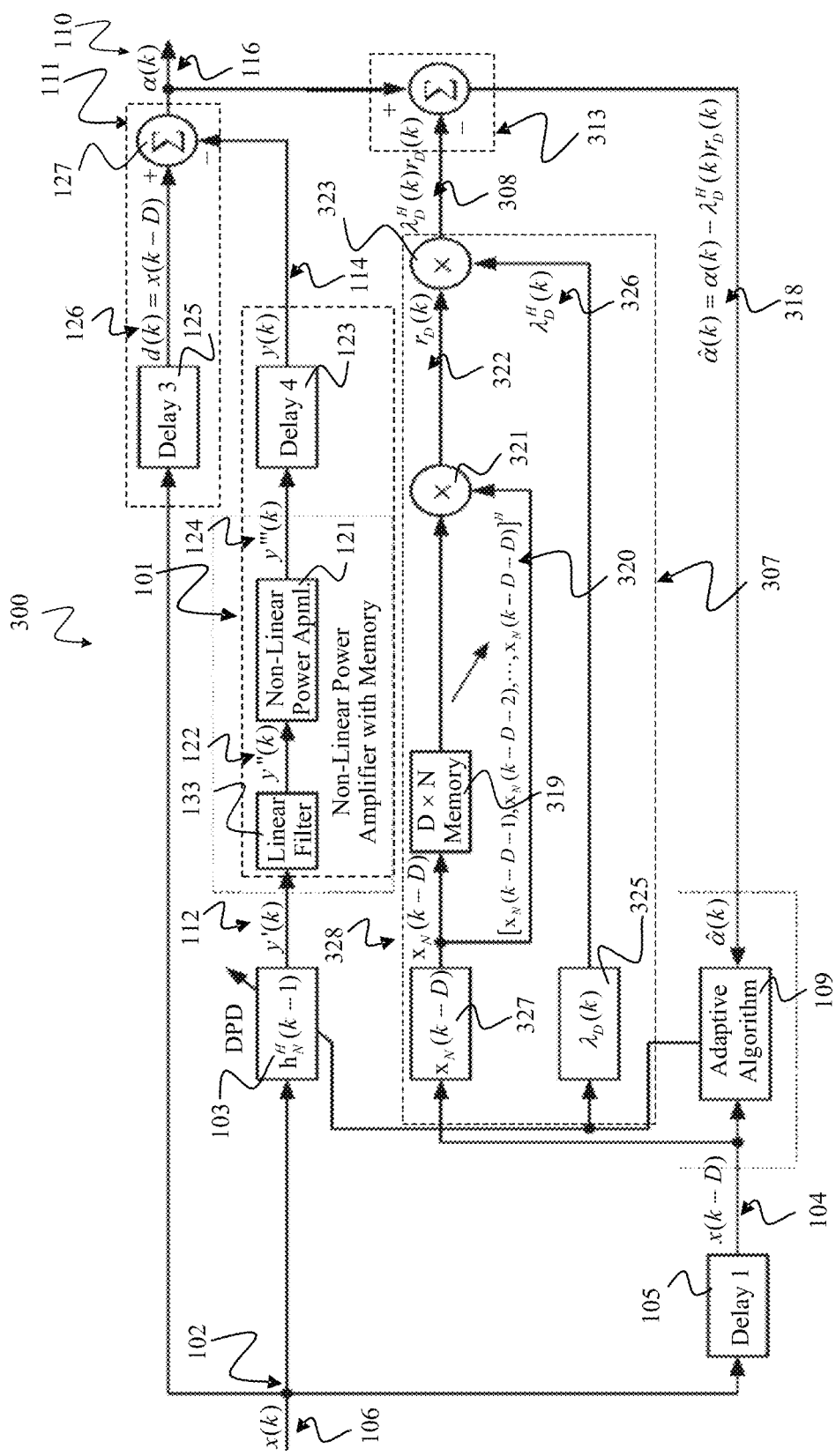
FIG. 3 shows a block diagram illustrating a predistortion device 300 including a modification according to an implementation form of a second architecture.
Figure 4:
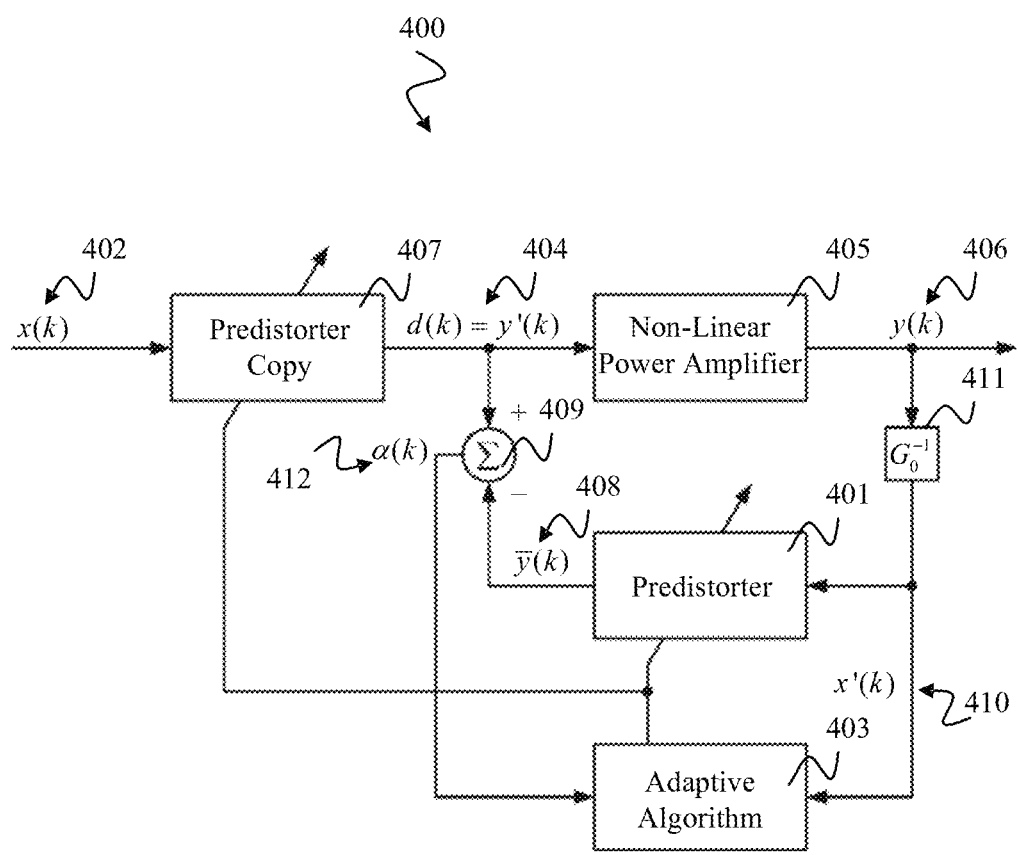
FIG. 4 shows a block diagram illustrating an indirect learning digital predistorter 400.
Figure 5:
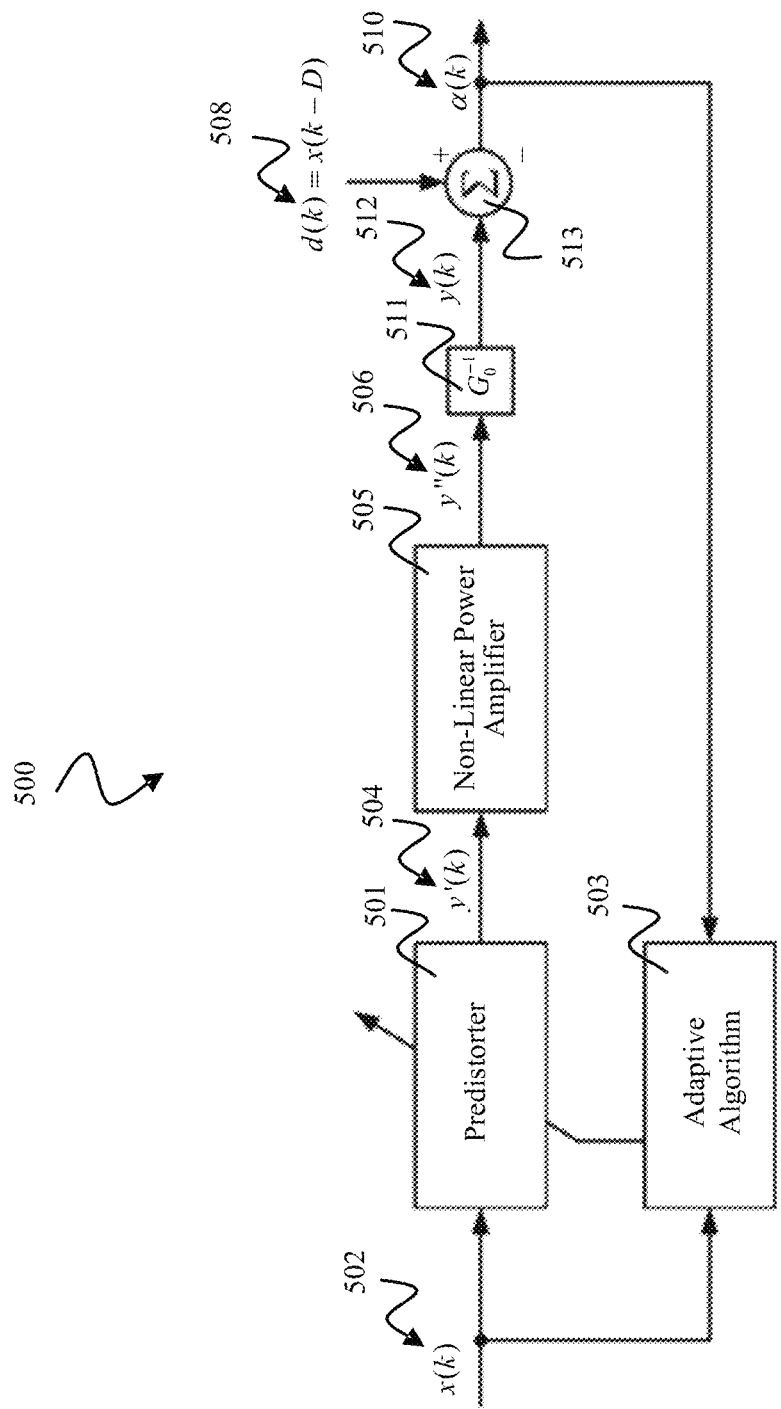
FIG. 5 shows a block diagram illustrating a direct learning digital predistorter 500.

The technologies described above with respect to FIGS. 11 and 13, applied to the direct learning Traditional DPD 700 of FIG. 7, produce two new architectures 100, 300 of the Modified DPD which are depicted in FIGS. 1 and 3 and described in the following.

The most general architecture is the direct learning Modified DPD, see FIG. 1. The other architectures, see FIGS. 2 and 3, can be viewed as the particular cases of the general architecture depicted in FIG. 1, if LMS algorithm is used.

The following reference signs are used in the description below with respect to FIGS. 1 to 3:
- 100: predistortion device 100
- 101: non-linear PA device
- 106: input signal
- 102: input terminal
- 103: predistortion filter
- 105: first delay element
- D: time delay
- 104: delayed input signal
- 120: adaptive filter unit
- 107: adaptive filter
- 109: adjusting unit, with adaptive algorithm
- 108: output signal of the adaptive filter
- 114: delayed output signal of the non-linear PA device
- 110: output terminal
- 116: first error signal
- 111: output processing stage
- 118: second error signal
- 113: error processing stage
- 112: output signal of the predistortion filter
- 117: second delay element
- 300: predistortion device
- 307: computational unit
- 319: memory
- 320: delayed samples of the delayed input signal
- 321: first multiplier
- 322: first filter signal
- 323: second multiplier
- 308: second filter signal
- 325: intermediate weight vector FIG. 1 shows a block diagram illustrating a predistortion device 100 including a modification according to an implementation form of a first architecture.

The predistortion device 100 may be applied to linearize a non-linear PA device 101. The predistortion device 100 includes an input terminal 102 for receiving an input signal 106. The predistortion device 100 further includes a predistortion filter 103, connected between the input terminal 102 and the non-linear PA device 101. The predistortion device 100 further includes a first delay element 105, coupled to the input terminal 102, and configured to delay the input signal 106 by a time delay (D) to provide a delayed input signal 104. The predistortion device 100 further includes an adaptive filter unit 120 which includes an Adaptive Filter 107 having adjustable filter weights and an adjusting unit 109. The Adaptive Filter 107 is configured to filter the delayed input signal 104 and the adjusting unit is configured to process an Adaptive Algorithm based on the delayed input signal 104 to adjust the filter weights of the Adaptive Filter (107) and to provide both the Adaptive Filter 107 and the predistortion filter 103 with the same adjusted filter weights. Both, the Adaptive Filter 107 and the adjusting unit 109 are coupled to the first delay element 105 in order to receive the same delayed input signal 104.

The adjusting unit 109 may adjust the filter weights of the Adaptive Filter 107 based on the delayed input signal 104, an output signal 108 of the Adaptive Filter 107 and a delayed output signal 114 of the non-linear PA device 101.

The predistortion device 100 further includes an output terminal 110 for providing a first error signal 116. The predistortion device 100 further includes an output processing stage 111, coupled between the non-linear PA device 101 and the output terminal 110. The predistortion device 100 may provide the first error signal 116 based on a combination of the delayed input signal 104 and the delayed output signal 114 of the non-linear PA device 101.

The adjusting unit 109 may adjust the filter weights of the Adaptive Filter 107 based on a relation between the delayed input signal 104 and a second error signal 118 that is derived from the first error signal 116 as described below.

The predistortion device 100 further includes an error processing stage 113 configured to provide the second error signal 118 based on a combination of the first error signal 116 and an output signal 108 of the Adaptive Filter 107.

The error processing stage 113 may provide the second error signal 118 based on a combination of the first error signal 116, the output signal 108 of the adaptive filter 107 and an output signal 112 of the predistortion filter 103 delayed by the time delay (D) as described below.

The Adaptive Filter 107 in the architecture of FIG. 1 includes a multi-channel FIR filter.

The predistortion device 100 further includes a second delay element 117, coupled to the predistortion filter 103, and configured to delay the output signal 112 of the predistortion filter 103 by the time delay D.

The adaptive algorithm 109 may be a gradient search based adaptive algorithm having a maximum step-size of approximately $$\frac{1}{3\sum_{m=1}^{M} N_m \sigma_{x_m}^2}.$$

Alternatively, the adaptive algorithm 109 may be a RLS adaptive filtering algorithm.

When comparing FIG. 1 and FIG. 11, it can be seen that both figures are very similar. The Primary 1101 and Secondary 1103 Acoustic Paths used in FIG. 11, e.g., acoustic filters, and the Secondary Acoustic Path Estimates 1111, 1113, e.g., the electrical (digital) filters are substituted in FIG. 1 by Delay 3, 125; Delay 4, 123; Delay 1, 105 and Delay 2, 117.

The modification of the direct learning Traditional DPD 700 of FIG. 7 is designed to provide the Adaptive Filter and the Adaptive Algorithm with the same delayed signal, that is x(k−D), 104 as shown in FIG. 1.

The error signal 118 for the Adaptive Algorithm 109 is produced in two steps in the direct learning Modified DPD 100 of FIG. 1.

Step 1: From the first error signal α(k), 116, the signal d(k), 126 is estimated as:

$$\hat{d}(k)=d(k)-y(k)+y'(k-D)=\alpha(k)+y'(k-D), \quad (20)$$

where $$y'(k-D)=h_N^H(k-D-1)x_N(k-D). \quad (21)$$

Step 2: The (second) error signal 118 for the Adaptive Algorithm 109 is defined as:

$$\hat{\alpha}(k)=\hat{d}(k)-\bar{y}(k), \quad (22)$$

where $$\bar{y}(k)=h_N^H(k-1)x_N(k-D). \quad (23)$$

As in the steady state $h_N(k-D-1)\approx h_N(k-1)$, then $y'(k-D)\approx \bar{y}(k)$ and $$\hat{\alpha}(k)=\hat{d}(k)-\bar{y}(k)=\alpha(k)+y'(k-D)-\bar{y}(k)\approx \alpha(k). \quad (24)$$

Applying the modification to the Traditional DPD 700 of FIG. 7, and to simplify it, substituting the "DPD+Linear Filter+Non-Linear PA+Delay 4" estimates by the Delay 3, 125, Delay 1, 105 and Delay 2, 117, the Modified DPD 100 appears in a form as shown in FIG. 1. In this architecture 100, the Adaptive Filter 107 and the Adaptive Algorithm 109 use the same signal vector, that is $x_N(k-D)$, 104. This allows to speed-up the LMS, NLMS and AP algorithms family by the selection of a larger value of the step-size μ according to equation (5). The modification also allows to use the RLS algorithm, if the correlation matrix $R_N(k)=E\{x_N(k)x_N^H(k)\}$ is not singular, where $E\{\bullet\}$ is an expectation operator.

Figure 2:
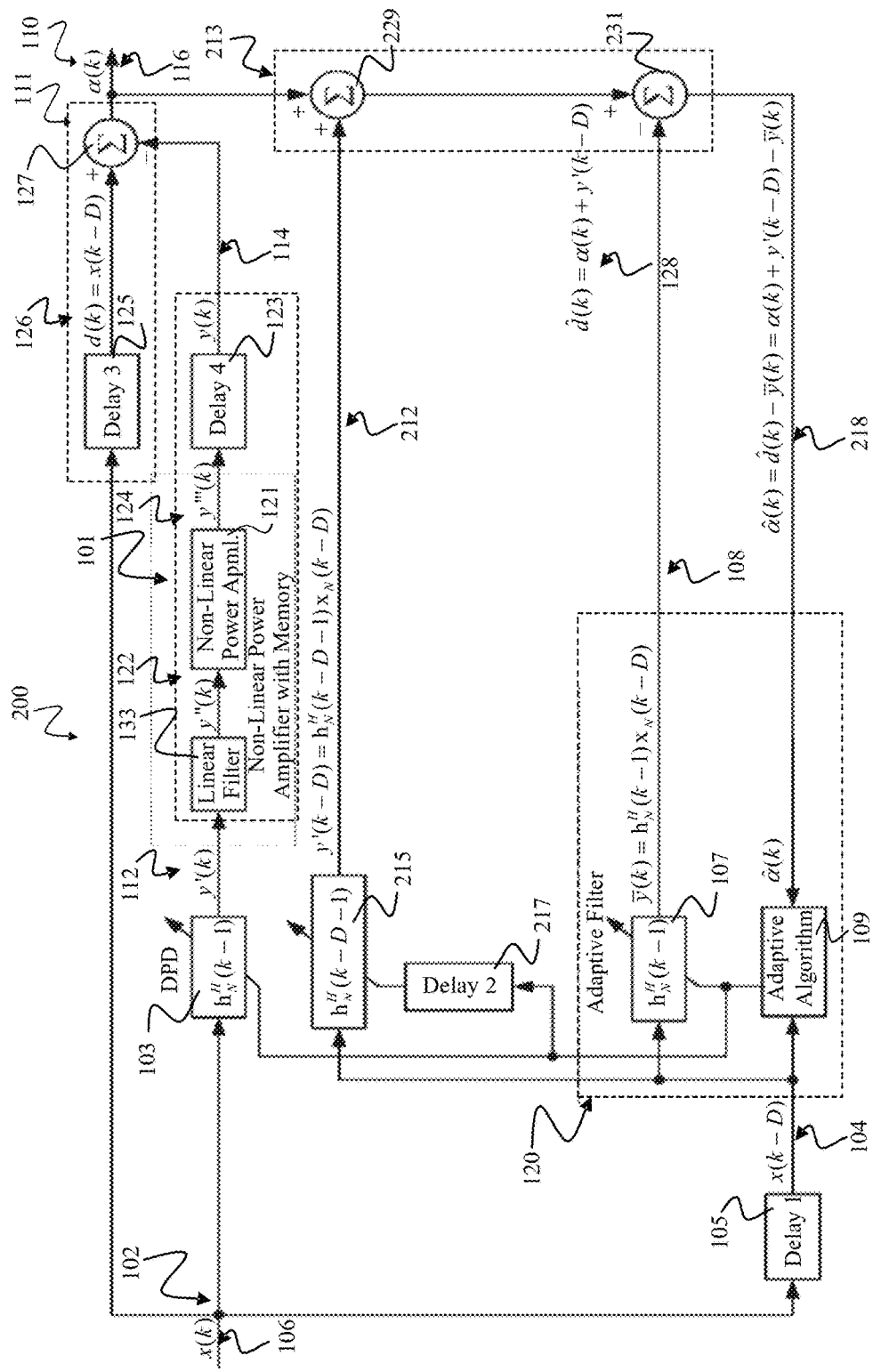
FIG. 2 shows a block diagram illustrating a predistortion device 200 including a modification according to an implementation form of an equivalent variant of the first architecture.

As the computation of the signal y'(k−D), 130, shown in FIG. 1, can be performed in the equivalent way as shown in FIG. 2, it is possible to compute the difference of the signals $y'(k-D)-\bar{y}(k)$ in equation (24) like equation (16), see FIG. 3 which shows a block diagram illustrating a predistortion device 300 including a modification according to an implementation form of a second architecture.

Really $$\hat{\alpha}(k) = \alpha(k) + h_N^H(k-D-1)x_N(k-D) - h_N^H(k-1)x_N(k-D) = \quad (25)$$
$$\alpha(k) - [h_N^H(k-1) - h_N^H(k-D-1)]x_N(k-D).$$

In equation (25), the value $h_N^H(k-1)-h_N^H(k-D-1)$ can be calculated in an indirect way. For that, let us present the equation for LMS algorithm for the DPD, see FIG. 1 and FIG. 2, $$h_N(k)=h_N(k)+\mu(k)x_N(k-D)\hat{\alpha}^*(k) \quad (26)$$

for D preceding samples. We will also use the VSS g(k) instead of a fixed one. This has to be taken in consideration, if the step-size is variable, e.g., time (sample) dependent.

So, for D preceding samples the equation (26) is presented as:

$$h_N(k-1) = h_N(k-2) + \mu(k-1)\ x_N(k-D-1)\ \hat{\alpha}^*(k-1), \quad (27)$$

$$h_N(k-2) = h_N(k-3) + \mu(k-2)\ x_N(k-D-2)\ \hat{\alpha}^*(k-2), \quad (28)$$

$$\vdots$$

$$h_N(k-D) = h_N(k-D-1) + \mu(k-D)\ x_N(k-D-D)\ \hat{\alpha}^*(k-D), \quad (29)$$

e.g., by means of D equations.

Using equations (28)-(29), the equation (27) can be presented as:

$$h_N(k-1) = \mu(k-1)x_N(k-D-1)\ \hat{\alpha}^*(k-1) + \quad (30)$$
$$\mu(k-2)x_N(k-D-2)\ \hat{\alpha}^*(k-2)$$

-continued $$+ \ldots +$$
$$\mu(k-D)x_N(k-D-D)\ \hat{\alpha}^*(k-D) + h_N(k-D-1).$$

Then, using equation (30), the vectors difference $h_N^H(k-1) - h_N^H(k-D-1)$ is presented as:

$$h_N(k-1) - h_N(k-D-1) = \mu(k-1)x_N(k-D-1)\ \hat{\alpha}^*(k-1) + \quad (31)$$
$$\mu(k-2)x_N(k-D-2)\ \hat{\alpha}^*(k-2)$$
$$+ \ldots +$$
$$\mu(k-D)x_N(k-D-D)\ \hat{\alpha}^*(k-D) +$$
$$h_N(k-D-1) - h_N(k-D-1)$$
$$= [x_N(k-D-1), x_N(k-D-2), \ldots ,$$
$$x_N(k-D-D)] \times$$
$$\begin{bmatrix} \mu(k-1)\ \hat{\alpha}^*(k-1) \\ \mu(k-2)\ \hat{\alpha}^*(k-2) \\ \vdots \\ \mu(k-D)\ \hat{\alpha}^*(k-D) \end{bmatrix}.$$

Now, using equation (31), the scalar product of the vectors $[h_N^H(k-1) - h_N^H(k-D-1)]$ and $x_N(k-D)$ in equation (25) can be computed as:

$$[h_N^H(k-1) - h_N^H(k-D-1)]x_N(k-D) = [\mu(k-1)\ \hat{\alpha}(k-1), \quad (32)$$
$$\mu(k-2)\ \hat{\alpha}(k-2), \ldots ,$$
$$\mu(k-D)\ \hat{\alpha}(k-D)] \times$$
$$\begin{bmatrix} x_N^H(k-D-1) \\ x_N^H(k-D-2) \\ \vdots \\ x_N^H(k-D-D) \end{bmatrix} x_N(k-D)$$
$$= .[\mu(k-1)\ \hat{\alpha}(k-1),$$
$$\mu(k-2)\ \hat{\alpha}(k-2), \ldots ,$$
$$\mu(k-D)\ \hat{\alpha}(k-D)] \times$$
$$\begin{bmatrix} r_1(k-D-1) \\ r_2(k-D-2) \\ \vdots \\ r_D(k-D-D) \end{bmatrix} = \lambda_D^H(l)r_D(k),$$

where $r_D(k)$ is defined according to equation (19) in the DPD case and $$\lambda_D(k) = [\mu(k-1)\hat{\alpha}^*(k-1), \mu(k-2)\hat{\alpha}^*(k-2), \ldots, \mu(k-D)\hat{\alpha}^*(k-D)]^T. \quad (33)$$

So, using equations (32), (33) and (19), the equation (25) can be computed as:

$$\hat{\alpha}(k) = \alpha(k) - \lambda_D^H(k)r_D(k). \quad (34)$$

Even equation (34) can be use for any values N, D and M, the computation of the equation is reasonable instead of equation (25), if N>>DM. This allows to decrease the computation complexity, if using equation (25) transformed to (34), instead of direct calculation of $\hat{\alpha}(k)$ by means of equations (21), (23) and (24).

The calculations, similar to equations (19), (33), (34), are also applied to the NLMS and AP adaptive filtering algorithms. The DPD architecture 300 according to FIG. 3 is mathematically equivalent to the ones shown in FIG. 1 and in FIG. 2, because DPD architecture 200 according to FIG. 2 is an intermediate version of DPD architecture 100 according to FIG. 1 and architecture 300 according to FIG. 3. The DPD architecture 200 according to FIG. 2 is presented for illustration purposed only for a better understanding of DPD architecture 300 according to FIG. 3.

Therefore, the predistortion device 300 of FIG. 3 includes the same elements as described above with respect to FIG. 1, e.g., non-linear PA device 101, first delay element 105, digital predistorter 103, output processing stage 111 and adaptive algorithm 109. However the implementation of the Adaptive Filter 107 and the elements, which produce the signal 118 $\hat{\alpha}(k)$, e.g., 103, 117, 129 and 131 in FIG. 1, or the elements 104. 107, 215, 217, 229 and 231 in FIG. 2, is differed as described in the following. In the above, in FIGS. 2 and 3, element 105 is also taken into the consideration because signal, coming through 103 and 117 in cascade in FIG. 1, e.g., y'(k−D), in FIG. 2 is produced as signal coming through 105 and 215. In FIG. 3 signal y'(k−D) is not produced explicitly, it is produced in y'(k−D)−ȳ(k) value, that is $-\lambda_D^H(k)r_D(k)$, see (24) and (34).

The above circuits that produce the signal 118 $\hat{\alpha}(k)$ in FIG. 1 or FIG. 2, in FIG. 3 are implemented, using first delay element 105, computational unit 307 and subtractor 313.

The computational unit 307 includes a memory 319 for storing a plurality of delayed samples 320 of the delayed input signal 104.

The computational unit 307 includes a first multiplier 321 for providing a first signal 322 based on a multiplication of the delayed input signal 104 with the delayed samples 320 stored in the memory 319. The computational unit 307 includes a second multiplier 323 for providing a second signal 308 based on a multiplication of the first signal 322 with an intermediate weight vector 325. "Intermediate weight vector" is used as a notation to differentiate this vector from the above used "adaptive filter weights". The adaptive algorithm 109 may be a gradient search based adaptive algorithm having a maximum step-size of approximately $$\frac{1}{3 \sum_{m=1}^{M} N_m \sigma_{x_m}^2}.$$

Alternatively, the adaptive algorithm 109 may be a RLS adaptive filtering algorithm.

The present disclosure also supports a method for predistorting a non-linear PA device. The method includes the following steps: filtering an input signal 106 with a predistortion filter 103 to provide a pre-distorted input signal 112 to the non-linear PA 101, e.g. according to the Modified DPD devices described above with respect to FIGS. 1 and 3; delaying the input signal 106 by a first time delay D to provide a delayed input signal 104, e.g. according to the Modified DPD devices described above with respect to FIGS. 1 and 3; filtering the delayed input signal 104 with an adaptive filter 107, or processing with a computational unit 307, e.g. according to the Modified DPD devices described above with respect to FIGS. 1 and 3; adjusting weights of the DPD 103 based on the delayed input signal 104, e.g. according to the Modified DPD devices described above with respect to FIGS. 1 and 3; and providing the DPD 103 with the adjusted filter weights, e.g. according to the Modified DPD devices described above with respect to FIGS. 1 and 3.

Figure 14:
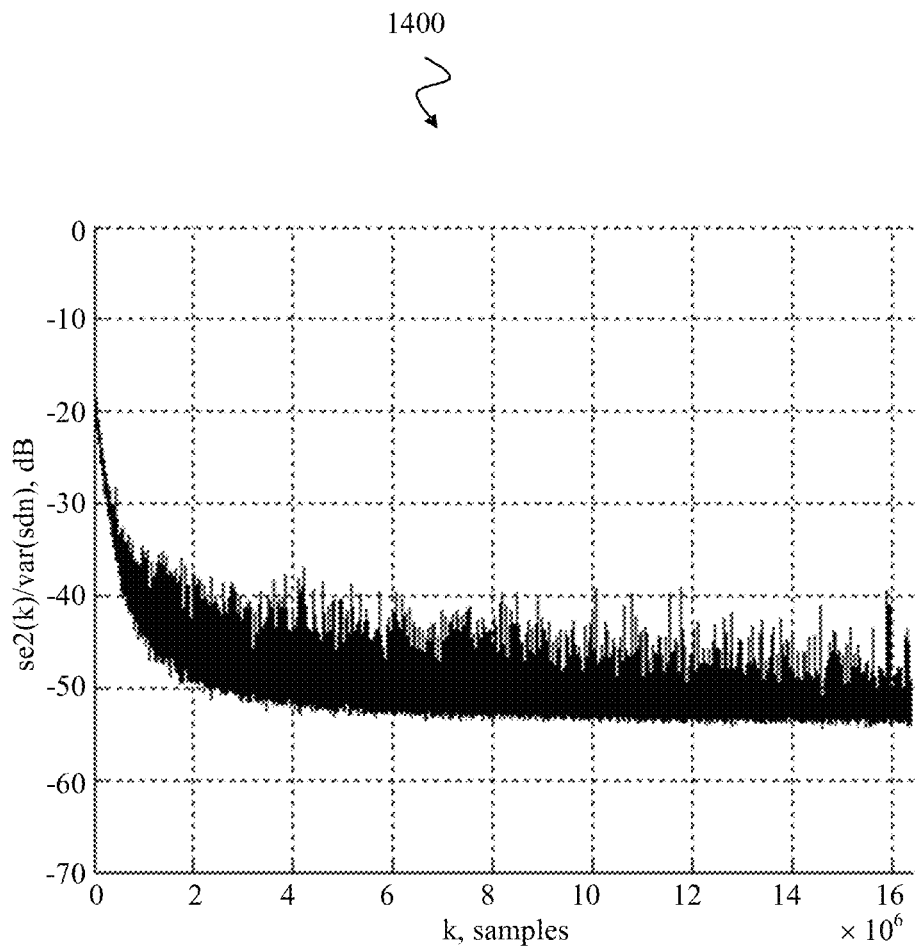
FIG. 14 shows a performance diagram illustrating short-time simulation results of the MSE 1400 for the Traditional DPD 700.
Figure 15:
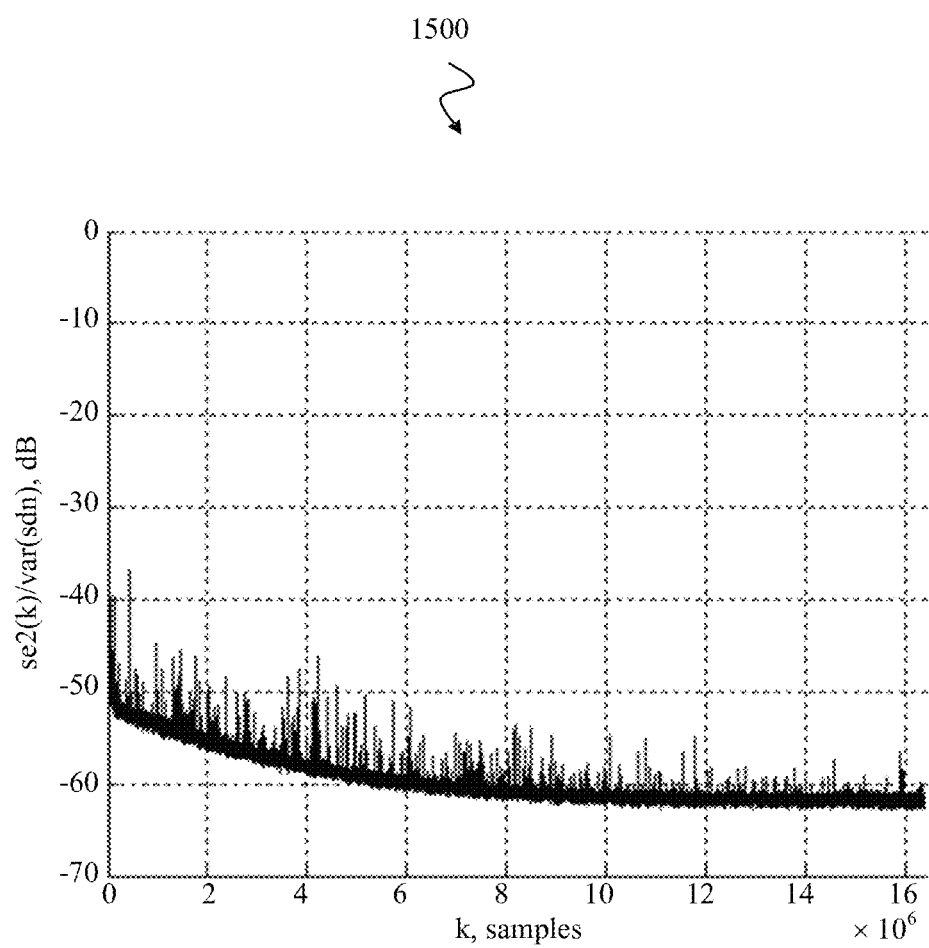
FIG. 15 shows a performance diagram illustrating short-time simulation results of the MSE 1500 for the Modified DPD 100 according to the disclosure.
Figure 16:
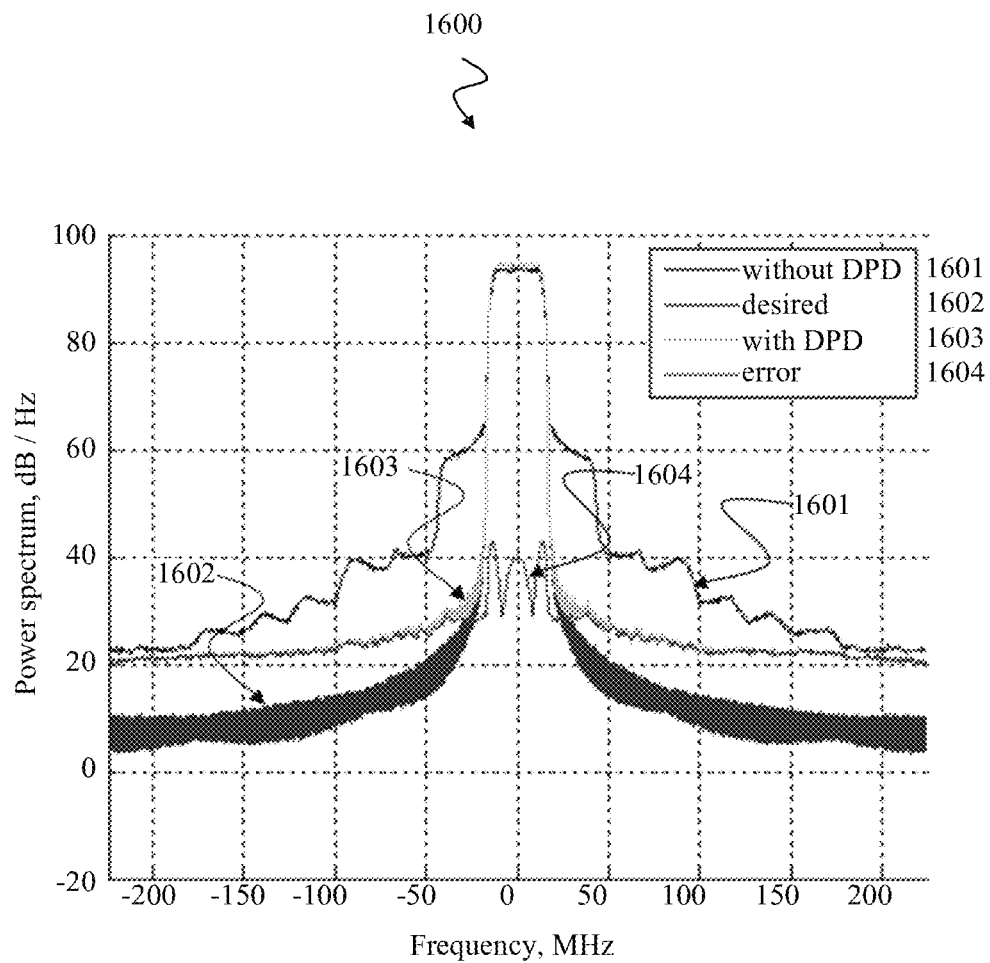
FIG. 16 shows a performance diagram illustrating short-time simulation results of the Power Spectral Density (PSD) 1600 for the Traditional DPD 700.
Figure 17:
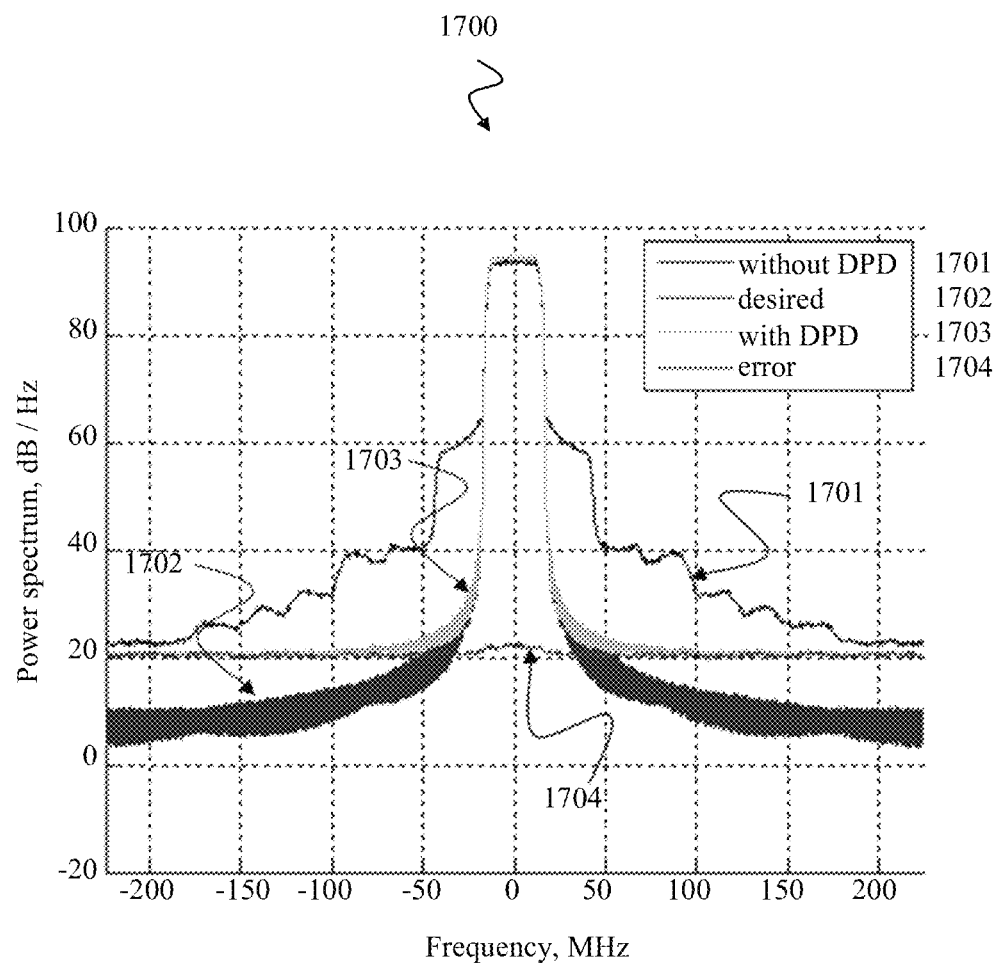
FIG. 17 shows a performance diagram illustrating short-time simulation results of PSD 1700 for the Modified DPD 100 according to the disclosure.
Figure 18:
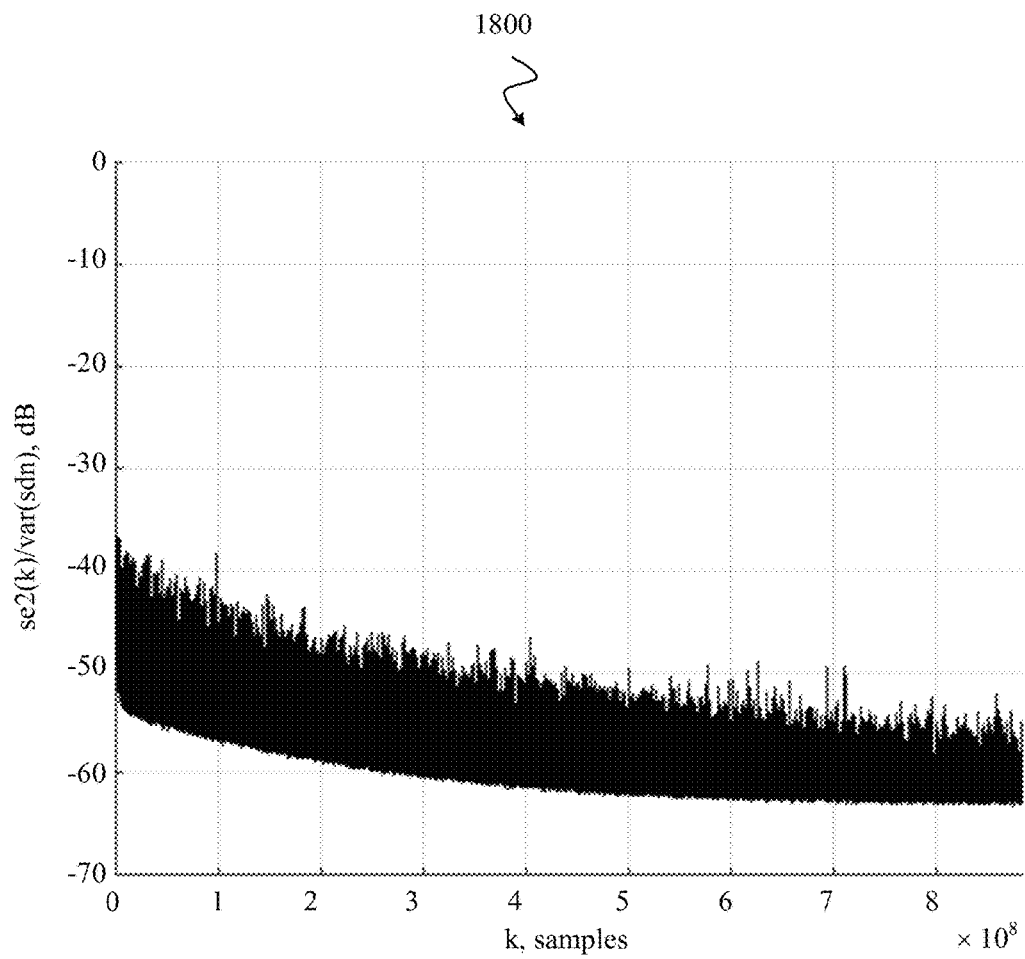
FIG. 18 shows a performance diagram illustrating long-time simulation results of the MSE 1800 for the Traditional DPD 700.
Figure 19:
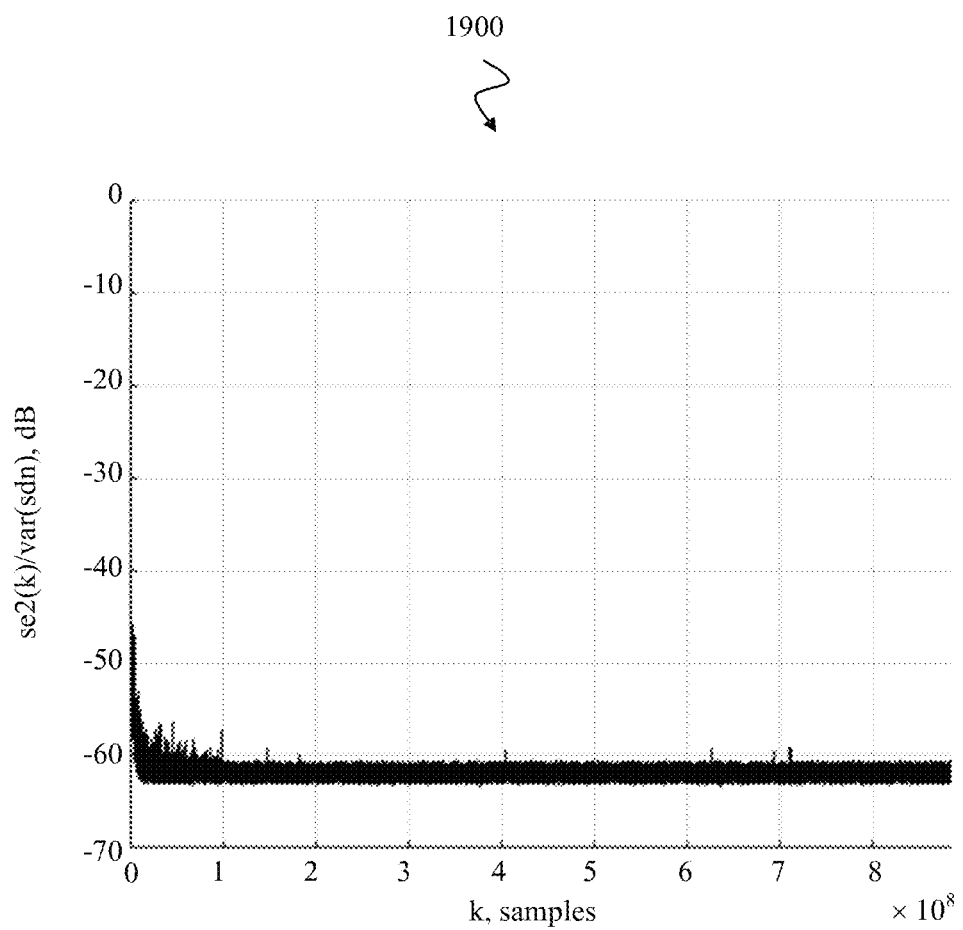
FIG. 19 shows a performance diagram illustrating long-time simulation results of the MSE 1900 for the Modified DPD 100 according to the disclosure.
Figure 20:
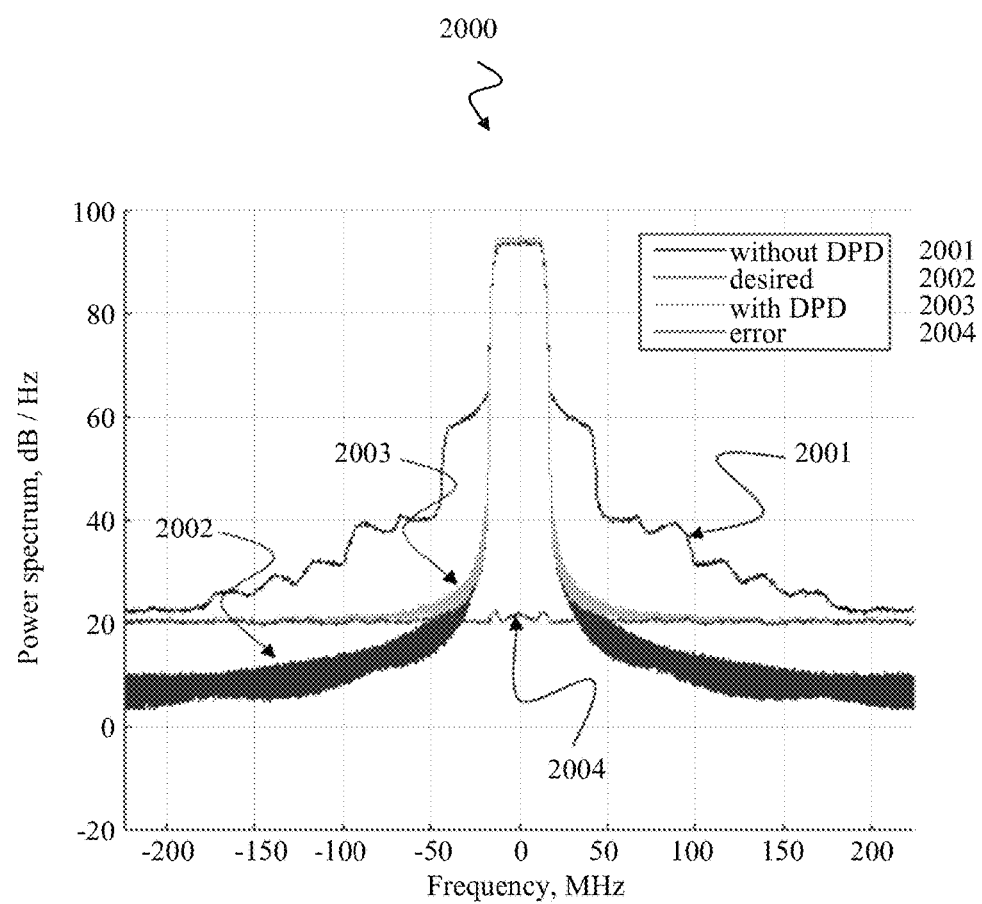
FIG. 20 shows a performance diagram illustrating long-time simulation results of the PSD 2000 for the Traditional DPD 700.
Figure 21:
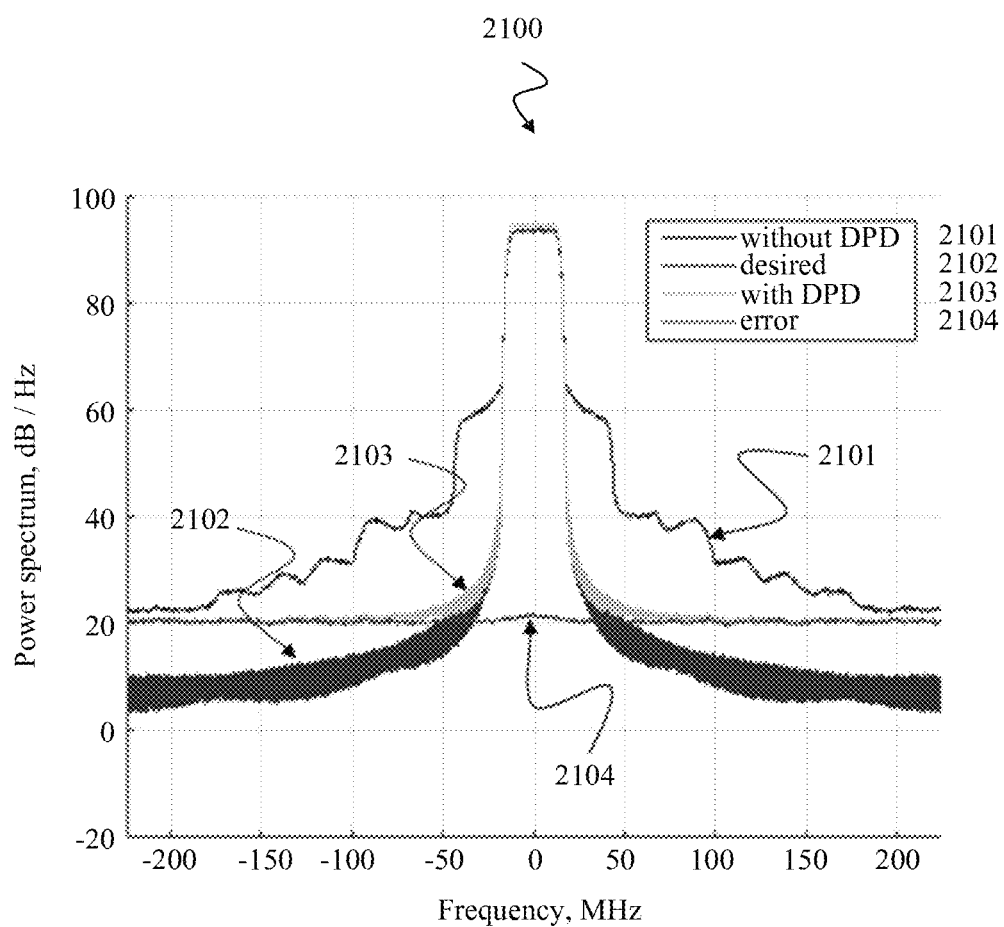
FIG. 21 shows a performance diagram illustrating long-time simulation results of the PSD 2100 for the Modified DPD 100 according to the disclosure.

To evaluate the performance of the given invention, a number of simulations have been conducted as presented by the following performance diagrams. FIG. 14 shows a performance diagram illustrating short-time simulation results of the MSE 1400 for the Traditional DPD 700. FIG. 15 shows a performance diagram illustrating short-time simulation results of the MSE 1500 for the Modified DPD 100 according to the disclosure. FIG. 16 shows a performance diagram illustrating short-time simulation results of the PSD 1600 for the Traditional DPD 700. FIG. 17 shows a performance diagram illustrating short-time simulation results of the PSD 1700 for the Modified DPD 100 according to the disclosure. FIG. 18 shows a performance diagram illustrating long-time simulation results of the MSE 1800 for the Traditional DPD 700. FIG. 19 shows a performance diagram illustrating long-time simulation results of the MSE 1900 for the Modified DPD 100 according to the disclosure. FIG. 20 shows a performance diagram illustrating long-time simulation results of the PSD 2000 for the Traditional DPD 700. FIG. 21 shows a performance diagram illustrating long-time simulation results of the PSD 2100 for the Modified DPD 100 according to the disclosure.

Examples of the simulation for the direct learning Traditional DPD 700 of FIG. 7, and for the direct learning Modified DPD 100 according to FIG. 1, are shown in FIGS. 14 to 17 for a short-time simulation for about $16.4 \cdot 10^6$ samples (the Adaptive Algorithm iteration number) and in FIGS. 18 to 21 for a long-time simulation for about $885 \cdot 10^6$ samples. The LMS algorithm was used. The step-size of the LMS algorithm in the direct learning Traditional DPD 700 was selected according to equation (3). The step-size of the LMS algorithm in the direct learning Modified DPD 100 was selected according to equation (5).

A non-linear PA with some sort of its non-linearity approximation by splines was used in the above simulations. The figures show the DPD transient response, measured in terms of MSE (FIGS. 14, 15 and 18, 19), that is $E\{\alpha^2(k)\}$ and in terms of PSD (FIGS. 16, 17 and 20, 21) at the PA output without DPD 1601, 1701, 2001, 2101 at desired signal d(k) 1602, 1702, 2002, 2102, at PA output y(k) with DPD, 1603, 1703, 2003, 2103 and at the error output α(k), 1604, 1704, 2004, 2104 for PA with DPD.

FIG. 15 and FIG. 19 show, that the Modified DPD 100, 300 overperforms the Traditional DPD 700 in terms of transient response duration. The numerical results of the simulation are shown in Table 1 and Table 2 below. For the considered case (the delay value D=1000 samples), the acceleration is about 54 times.

For a short time, the Modified DPD 100, 300 achieves about the same MSE as the Traditional DPD 700 achieves for a long-time only. Besides, the spikes of the MSE in the Modified DPD 100, 300 are obviously much less. The declared quality is also demonstrated by means of the PSD plots, see FIGS. 17 and 21.

Tables 1 and 2 show the numerical results of the simulation.

TABLE 1

| | | MSE | | | | | |
|---|---|---|---|---|---|---|---|
| | | Traditional 700* | | | Modified 100, 300* | | |
| # | Algorithm | Full-band MSE, dB | In-band MSE, dB | Out-band MSE, dB | Full-band MSE, dB | In-band MSE, dB | Out-band MSE, dB |
| 1 | LMS | −52.59 | −53.74 | −58.93 | −61.79 | −72.07 | −62.21 |
| | | −61.71 | −72.11 | −62.13 | −61.77 | −71.53 | −62.25 |
| 2 | RLS | ** | ** | ** | −61.96 | −73.24 | −62.29 |

TABLE 2

| | | TRANSIENT RESPONSE DURATION | | | | | |
|---|---|---|---|---|---|---|---|
| | | Traditional 700* | | | Modified 100, 300 * | | |
| # | Algorithm | Iterations *** | Seconds *** | Compar. to RLS/LMS | Iterations *** | Seconds *** | Compar. to RLS/LMS |
| 1 | LMS | >900 000 000 | >2.00 | >1770/54 | 16 000 000 | 0.0357 | 32/1.00 |
| 2 | RLS | ** | ** | ** | 00 500 000 | 0.0011 | 01/0.03 |

In Table 1 and 2 the following notation is used:

*—results for the Traditional DPD 700 compared to those of the Modified DPD 100, 300, obtained for algorithms iterations 16384000 and 884736000;

—sample by sample RLS are not stable in the Traditional DPD 700**

***—estimated, using transient responses figures

****—estimated, using sampling frequency $F_S$=408 MHz, as Iterations/$F_S$.

The new direct learning Modified DPD can be used for non-linear PA linearization of transmitters in a plurality of communication systems, in particular wireless, wired or fiber communication systems.

The present disclosure supports both a hardware and a computer program product including computer executable code or computer executable instructions that, when executed, causes at least one computer to execute the performing and computing steps of the method as described above and the techniques as described above with respect to FIGS. 1 and 3. Such a computer program product may include a readable storage medium storing program code thereon for use by a computer.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A device, comprising:
   an input terminal configured to receive an input signal;
   a predistortion filter, connected between the input terminal and a non-linear power amplifier (PA), the predistortion filter having second filter weights;
   a first delay element coupled to the input terminal, and configured to delay the input signal by a time delay D to provide a delayed input signal;
   an adaptive filter having first filter weights, and configured to filter the delayed input signal; and
   an adjuster configured to, according to an adaptive algorithm and the delayed input signal, adjust the first filter weights of the adaptive filter and the second filter weights of the predistortion filter so that the first filter weights are the same as the second filter weights,
   wherein both the adaptive filter and the adjuster are coupled to the first delay element to receive the delayed input signal.

2. The device of claim 1, wherein the adjuster is further configured to adjust the first filter weights of the adaptive filter based one an output signal of the adaptive filter, and a delayed output signal of the non-linear PA.

3. The device of claim 2, comprising:
   an output terminal configured to provide a first error signal; and
   an output processing stage, coupled between the non-linear PA and the output terminal, and configured to provide the first error signal based on a combination of the delayed input signal and the delayed output signal of the non-linear PA.

4. The device of claim 3, wherein the adjuster is configured to adjust the first filter weights of the adaptive filter based on a relationship between the delayed input signal and a second error signal derived from the first error signal.

5. The device of claim 4, comprising:
   an error processing stage configured to provide the second error signal based on a combination of the first error signal and an output signal of the adaptive filter.

6. The device of claim 5, wherein the error processing stage is configured to provide the second error signal based on a combination of the first error signal, the output signal of the adaptive filter, and an output signal of the predistortion filter delayed by the time delay D using a second delay element.

7. The device of claim 6, wherein second delay element is coupled to the predistortion filter and configured to delay the output signal of the predistortion filter by the time delay D.

8. The device of claim 7, wherein the adaptive filter and the second delay element are implemented by a computational circuit.

9. The device claim 8, wherein the computational circuit comprises a memory configured to store a plurality of delayed samples of the delayed input signal.

10. The device of claim 9, wherein the computational circuit comprises a first multiplier configured to provide a first signal based on a multiplication of the delayed input signal with the plurality of delayed samples stored in the memory.

11. The device of claim 10, wherein the computational circuit comprises a second multiplier configured to provide a second signal based on a multiplication of the first signal with a weight vector.

12. The device of claim 1, wherein the adaptive filter comprises a multi channel finite impulse response (FIR) filter.

13. The device of claim 1, wherein the adaptive algorithm is a gradient search based adaptive algorithm having a maximum step size of $$\frac{1}{3\sum_{m=1}^{M} N_m \sigma_{x_m}^2},$$

where $N_m$ is the number of weights in an m-th channel of an M channel filter and $\sigma_{x_m}^2$ is a variance of the input signal of the m-th channel.

14. The device of claim 1, wherein the adaptive algorithm is a Recursive Least Squares (RLS) adaptive filtering algorithm.

15. A method, comprising:
   filtering, by a device, an input signal with a predistortion filter to provide a pre-distorted input signal to a non-linear power amplifier (PA);
   delaying, by the device, the input signal by a first time delay D to provide a delayed input signal;

filtering, by the device, the delayed input signal with an adaptive filter;

processing, by the device, the delayed input signal in a computational circuit; and adjusting, by the device, first filter weights of the adaptive filter and a second filter weight of the computational circuit based on the delayed input signal, wherein adjusting the first filter weight and the second filter weight comprises making the first filter weight the same as the second filter weight.

16. The method of claim 15, wherein adjusting the first filter weights of the adaptive filter comprises adjusting the first filter weights of the adaptive filter based on an output signal of the adaptive filter and a delayed output signal of the non-linear PA.

17. The method of claim 16, wherein the method comprises:

providing a first error signal based on a combination of the delayed input signal and the delayed output signal of the non-linear PA.

18. The method of claim 17, wherein adjusting the first filter weights of the adaptive filter comprises adjusting the first filter weights based on a relation between the delayed input signal and a second error signal derived from the first error signal.

19. The method of claim 18, wherein the method comprises:

providing the second error signal based on a combination of the first error signal and an output signal of the adaptive filter.

20. The method of claim 19, wherein providing the second error signal comprises providing the second error signal based on a combination of the first error signal, the output signal of the adaptive filter, and an output signal of the predistortion filter delayed by the first time delay D using a second delay element.

* * * * *